United States Patent
Sasa et al.

(10) Patent No.: US 10,400,760 B2
(45) Date of Patent: Sep. 3, 2019

(54) LIQUID DELIVERY METHOD, LIQUID DELIVERY SYSTEM, AND COMPUTER-READABLE STORAGE MEDIUM

(71) Applicant: Tokyo Electron Limited, Tokyo (JP)

(72) Inventors: Takashi Sasa, Koshi (JP); Katsuya Hashimoto, Koshi (JP); Daiki Shibata, Koshi (JP); Takeshi Ohto, Koshi (JP)

(73) Assignee: TOKYO ELECTRONIC LIMITED, Tokyo (JP)

( * ) Notice: Subject to any disclaimer, the term of this patent is extended or adjusted under 35 U.S.C. 154(b) by 220 days.

(21) Appl. No.: 14/918,674

(22) Filed: Oct. 21, 2015

(65) Prior Publication Data
US 2016/0116845 A1  Apr. 28, 2016

(30) Foreign Application Priority Data

Oct. 23, 2014 (JP) .................................. 2014-216461

(51) Int. Cl.
*F04B 49/06* (2006.01)
*F04B 43/00* (2006.01)
(Continued)

(52) U.S. Cl.
CPC ........ *F04B 49/065* (2013.01); *F04B 43/0072* (2013.01); *F04B 43/08* (2013.01);
(Continued)

(58) Field of Classification Search
None
See application file for complete search history.

(56) References Cited

U.S. PATENT DOCUMENTS

2003/0180471 A1* 9/2003 Takekuma .......... H01L 21/6715
430/271.1
2006/0102652 A1* 5/2006 O'Dougherty ....... B67D 7/0261
222/1
(Continued)

FOREIGN PATENT DOCUMENTS

JP     2005-504908 A     2/2005
JP     2005-534848 A    11/2005
(Continued)

OTHER PUBLICATIONS

Nikolov et al. ("Virtual Techniques for Liquid Level Monitoring Using Differential Pressure Sensors").*
(Continued)

*Primary Examiner* — Brian W Wathen
*Assistant Examiner* — Hung H Dang
(74) *Attorney, Agent, or Firm* — Pearne & Gordon LLP

(57) ABSTRACT

A liquid can be delivered with a simple configuration. A liquid delivery method includes allowing a liquid to flow in a tube having elasticity depending on a pressure of a gas filled in an inner space between a tube housing covering an outside of the tube and an outer surface of the tube; obtaining a magnitude of a pressure of the liquid flowing in the tube as a first value; obtaining a magnitude of the pressure of the gas filled in the inner space as a second value; calculating a difference between the first value and the second value as a third value; and detecting a status of the tube on the basis of the third value.

9 Claims, 17 Drawing Sheets

(51) Int. Cl.
| | |
|---|---|
| *F04B 43/08* | (2006.01) |
| *F04B 43/10* | (2006.01) |
| *F04B 51/00* | (2006.01) |
| *G03F 7/16* | (2006.01) |
| *H01L 21/67* | (2006.01) |

(52) U.S. Cl.
CPC ............ *F04B 43/084* (2013.01); *F04B 43/10* (2013.01); *F04B 51/00* (2013.01); *G03F 7/162* (2013.01); *H01L 21/6715* (2013.01)

(56) References Cited

U.S. PATENT DOCUMENTS

| | | | |
|---|---|---|---|
| 2010/0025428 A1* | 2/2010 | Ng | B05C 17/00573 222/61 |
| 2011/0186757 A1* | 8/2011 | Kawamura | B67C 3/28 251/5 |

FOREIGN PATENT DOCUMENTS

| | | |
|---|---|---|
| JP | 2007-154767 A | 6/2007 |
| WO | 03/029133 A1 | 4/2003 |
| WO | 2004/011806 A1 | 2/2004 |

OTHER PUBLICATIONS

Nikolov, "Virtual Techniques for Liquid Level Monitoring Using Differential Pressure Sensors", 2008, Recent, vol. 9, pp. 49-54 (Year: 2008).*

* cited by examiner

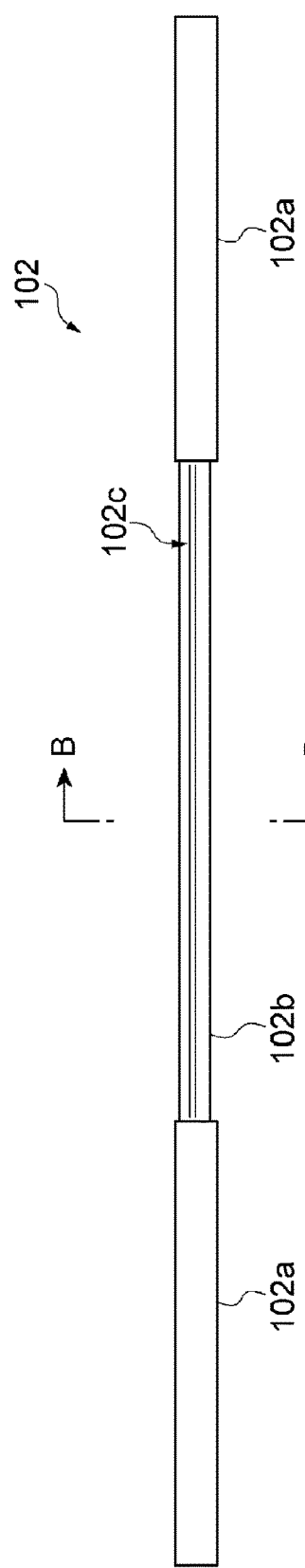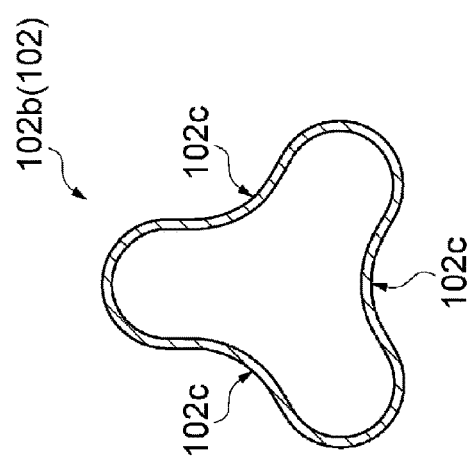

LIQUID DELIVERY METHOD, LIQUID DELIVERY SYSTEM, AND COMPUTER-READABLE STORAGE MEDIUM

CROSS-REFERENCE TO RELATED APPLICATION

This application claims the benefit of Japanese Patent Application No. 2014-216461 filed on Oct. 23, 2014, the disclosures of which are incorporated herein by reference.

TECHNICAL FIELD

The embodiments described herein pertain generally to a liquid delivery method, a liquid delivery system, and a computer-readable storage medium therefor.

BACKGROUND

A pump is described in Patent Document 1. The pump includes a cylindrical body, a tube coaxially arranged within the cylindrical body, a cylinder communicating with an inner space between the cylindrical body and the tube, a piston arranged within the cylinder, a motor for driving the piston, and a pressure sensor for measuring a pressure of a working liquid filled in the inner space.

In case of pushing out a delivery liquid in the tube, the motor drives the piston to apply a pressure to the working liquid within the inner space. Then, the pressure is applied to the tube via the working liquid. Thus, the delivery liquid within the tube is discharged to the outside of the tube.

Since a liquid is an incompressible fluid, a pressure of the working liquid is in approximately direct proportion to a discharge amount of the delivery liquid from the tube. Therefore, a driving amount of the piston is controlled according to a pressure of the working liquid measured by the pressure sensor, so that a discharge flow rate of the delivery liquid from the tube can be controlled.

Patent Document 1: Japanese Patent Laid-open Publication No. 2007-154767

SUMMARY

In the pump described in Patent Document 1, a liquid (working liquid) is used as a working fluid by which the tube is operated. For this reason, a structure for suppressing a leakage of the working liquid is needed. A relatively complicated driving mechanism such as a piston or a motor is also needed to apply a pressure to the working liquid.

Therefore, the present disclosure describes a liquid delivery method and a liquid delivery system configured to allow a liquid to be delivered with a simple configuration, and a computer-readable storage medium therefor.

In one exemplary embodiment, a liquid delivery method includes allowing a liquid to flow in a tube having elasticity depending on a pressure of a gas filled in an inner space between a tube housing covering an outside of the tube and an outer surface of the tube; obtaining a magnitude of a pressure of the liquid flowing in the tube as a first value; obtaining a magnitude of the pressure of the gas filled in the inner space as a second value; calculating a difference between the first value and the second value as a third value; and detecting a status of the tube on the basis of the third value.

In the liquid delivery method, the inner space between the tube housing covering the outside of the tube and the outer surface of the tube is filled with the gas. That is, the gas is used as a working fluid for operating the tube. For this reason, a device configured to supply the gas into the inner space and discharge the gas from the inner space is needed, but a relatively complicated driving mechanism such as a piston or a motor may not be required. Therefore, the liquid delivery method enables a liquid to be delivered with a simple configuration.

Meanwhile, for example, if the working gas within the inner space is highly pressurized and thus a pressure is applied to the tube by the working gas, the tube is deformed to be crushed, and a reaction force trying to return to its original shape is generated in a radially outward direction with respect to the tube. Since a gas is a compressible fluid, if the reaction force is generated in the radially outward direction with respect to the tube, a pressure substantially applied to the delivery liquid via the tube is decreased. Further, as a deformation amount of the tube increases, the reaction force generated in the radially outward direction with respect to the tube tends to increase. Therefore, it is difficult to check a status of the tube on the basis of a pressure of the working gas in the same manner as the pump described in Patent Document 1 that controls a driving amount of the piston on the basis of a pressure of the working liquid assuming that a pressure of the working liquid is in approximately direct proportion to a flow rate of the delivery liquid from the tube. It is the same in a case where the working gas within the inner space has a low pressure and the crushed tube is expanded to return to the original shape thereof.

Herein, a difference between the pressure of the working gas applied to the tube from the outside and the pressure of the delivery liquid applied to the tube from the inside corresponds to a pressure substantially applied to the tube. For this reason, as the difference increases, the deformation amount of the tube increases and also, the reaction force generated in the tube increases. With attention to this phenomenon, in the liquid delivery method, a status of the tube is detected on the basis of a difference (third value) between a magnitude of the pressure of the delivery liquid (first value) and a magnitude of the pressure of the working gas (second value). As a result, the status of the tube, which is difficult to be directly detected by a device such as a sensor, can be appropriately detected with the third value.

The liquid delivery method may further include supplying the gas into the inner space or discharging the gas from the inner space to maintain the first value at a predetermined value. In this case, a discharge flow rate of the liquid from the tube or a filling flow rate of the liquid into the tube serves as a predetermined flow rate. If the discharge flow rate is the predetermined flow rate, it becomes easy to uniformly supply the liquid to a target to be supplied with the liquid. If the filling flow rate is the predetermined flow rate, it becomes difficult to excessively fill the tube with the liquid, and, thus, it is possible to suppress damage on the tube.

In the detecting of the status of the tube, under a state where an inside of the tube is filled with the liquid as the gas is discharged from the inner space, when the third value reaches a first threshold value, it may be detected that a filling of the liquid in the tube is completed. In this case, a difference between a magnitude of the pressure of the delivery liquid and a magnitude of the pressure of the working gas in a desired state where the tube is filled with the liquid is obtained in advance, and, thus, it is possible to detect the completion of the filling of the tube with the liquid. Meanwhile, as a pressure around the tube decreases, the tube tries to return to the original shape from the crushed shape, and, thus, the filling of the tube with the liquid is accelerated. Further, when the tube tries to return to the original shape from the crushed shape, the reaction force generated in the radially outward direction with respect to the tube decreases. The reaction force can be measured on the basis of the difference (third value) between the magnitude of the pressure of the delivery liquid and the magnitude of the pressure of the working gas. Therefore, it is possible to indirectly check the filling state of the tube with the liquid on the basis of the difference. Accordingly, a difference between a magnitude of the pressure of the delivery liquid and a magnitude of the pressure of the working gas when the tube is filled with the liquid and the tube returns to its approximately original shape is set in advance as the first threshold value. As a result, it is possible to fill the tube with a sufficient amount of the liquid and also possible to suppress the tube from being excessively filled with the liquid.

The liquid delivery method may further include stopping a discharge of the gas from the inner space when the third value reaches the first threshold value.

In the detecting of the status of the tube, under a state where the liquid is discharged from the tube as the gas is supplied into the inner space, when the third value reaches a second threshold value, it may be detected that a discharge of the liquid from the tube is completed. In this case, a difference between a magnitude of the pressure of the delivery liquid and a magnitude of the pressure of the working gas in a desired state where the liquid is discharged from the tube is obtained in advance, and, thus, it is possible to detect the completion of the discharge of the liquid from the tube. Meanwhile, as a pressure around the tube increases, the tube is deformed from the original shape to the crushed shape, and, thus, the discharge of the liquid from the tube is accelerated. Further, when the tube is deformed from the original shape to the crushed shape, the reaction force generated in the radially outward direction with respect to the tube increases. The reaction force can be measured on the basis of a difference (third value) between the magnitude of the pressure of the delivery liquid and the magnitude of the pressure of the working gas. Therefore, it is possible to indirectly check a discharge state of the liquid from the tube on the basis of the difference. Accordingly, a difference between a magnitude of the pressure of the delivery liquid and a magnitude of the pressure of the working gas when the tube is completely crushed is set in advance as the second threshold value, and, thus, it is possible to discharge almost the whole amount of the liquid within the tube and also possible to suppress the tube from being excessively applied with the pressure of the working gas.

The liquid delivery method may further include stopping a supply of the gas into the inner space when the third value reaches the second threshold value.

When the third value is lower than the second threshold value, a discharge amount of the liquid from the tube may be estimated on the basis of the third value. The third value indirectly shows the reaction force generated in the tube according to the deformation of the tube, and the discharge amount of the liquid from the tube varies depending on the reaction force. For this reason, by calculating the third value, it is possible to obtain an estimated value of the discharge amount.

In another exemplary embodiment, a liquid delivery system includes a pump; a first pressure measurement unit and a second pressure measurement unit; and a control unit. Further, the pump includes a tube, having elasticity, in which a liquid as a delivery target flows; a tube housing which covers an outside of the tube and keeps a gas in an inner space between an outer surface of the tube and the tube housing; and a supply/discharge unit configured to supply the gas into the inner space and discharge the gas from the inner space. Further, the first pressure measurement unit is configured to measure a magnitude of a pressure of the liquid flowing in the tube, and the second pressure measurement unit is configured to measure a magnitude of a pressure of the gas in the inner space. Moreover, the control unit is configured to calculate, as a third value, a difference between a first value as the magnitude of the pressure measured by the first pressure measurement unit and a second value as the magnitude of the pressure measured by the second pressure measurement unit, and configured to detect a status of the tube on the basis of the third value.

The liquid delivery system, in common with the above-described method, enables a liquid to be delivered with a simple configuration.

In yet another exemplary embodiment, a computer-readable storage medium stores thereon computer-executable instructions that, in response to execution, cause a liquid delivery system to perform the liquid delivery method. The computer-readable storage medium, in common with the above-described method, enables a liquid to be delivered with a simple configuration. In the present specification, the computer-readable storage medium includes a non-temporary type medium (a non-transitory computer recording medium) (e.g., various kinds of main storage device or auxiliary storage device) or propagation signals (a transitory computer recording medium) (e.g., data signals which can be provided via a network).

According to the above-described liquid delivery method, liquid delivery system and computer-readable storage medium, it is possible to deliver a liquid with a simple configuration.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 7A is a side view illustrating a tube, and FIG. 7B is a cross-sectional view taken along a line B-B of FIG. 7A;

DETAILED DESCRIPTION

Figure 1:
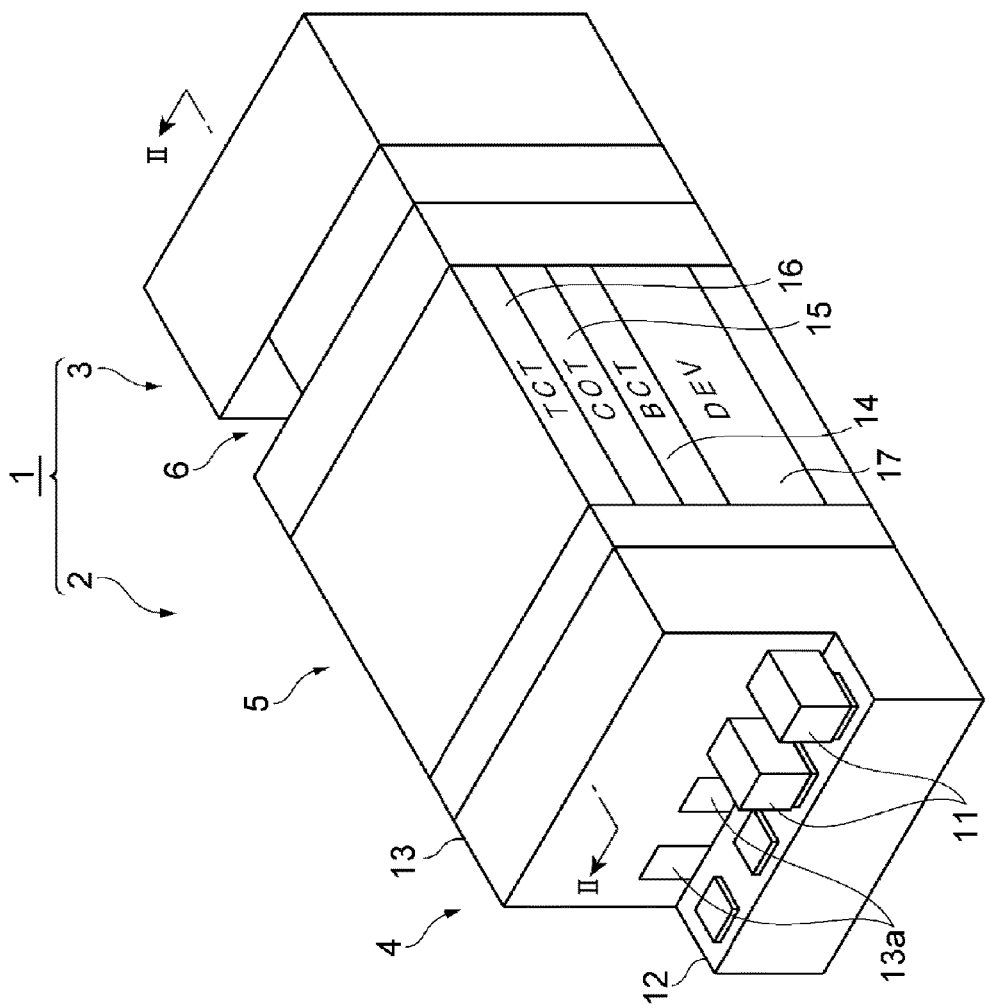
FIG. 1 is a perspective view illustrating a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

<Configuration of Substrate Processing System>

A substrate processing system 1 includes a coating and developing device 2 and an exposure device 3. The exposure device 3 is configured to perform an exposure process on a resist film. To be specific, the exposure device 3 is configured to irradiate an energy line to a portion as an exposure target in the resist film (photosensitive film) by immersion lithography or the like. The energy line may include, for example, an ArF excimer laser, a KrF excimer laser, a g-ray, an i-ray, or an extreme ultraviolet (EUV) ray.

The coating and developing device 2 is configured to form a resist film on a surface of a wafer W (substrate) before the exposure process by the exposure device 3, and also perform a developing process of the resist film after the exposure process. In the present exemplary embodiment, the wafer W has a circular plate shape. However, there may be used a wafer having a circular shape of which a part is notched or having other polygonal shapes instead of the circular shape. The wafer W may include, for example, a semiconductor substrate, a glass substrate, a mask substrate, an FPD (Flat Panel Display) substrate, and various other substrates.

Figure 2:
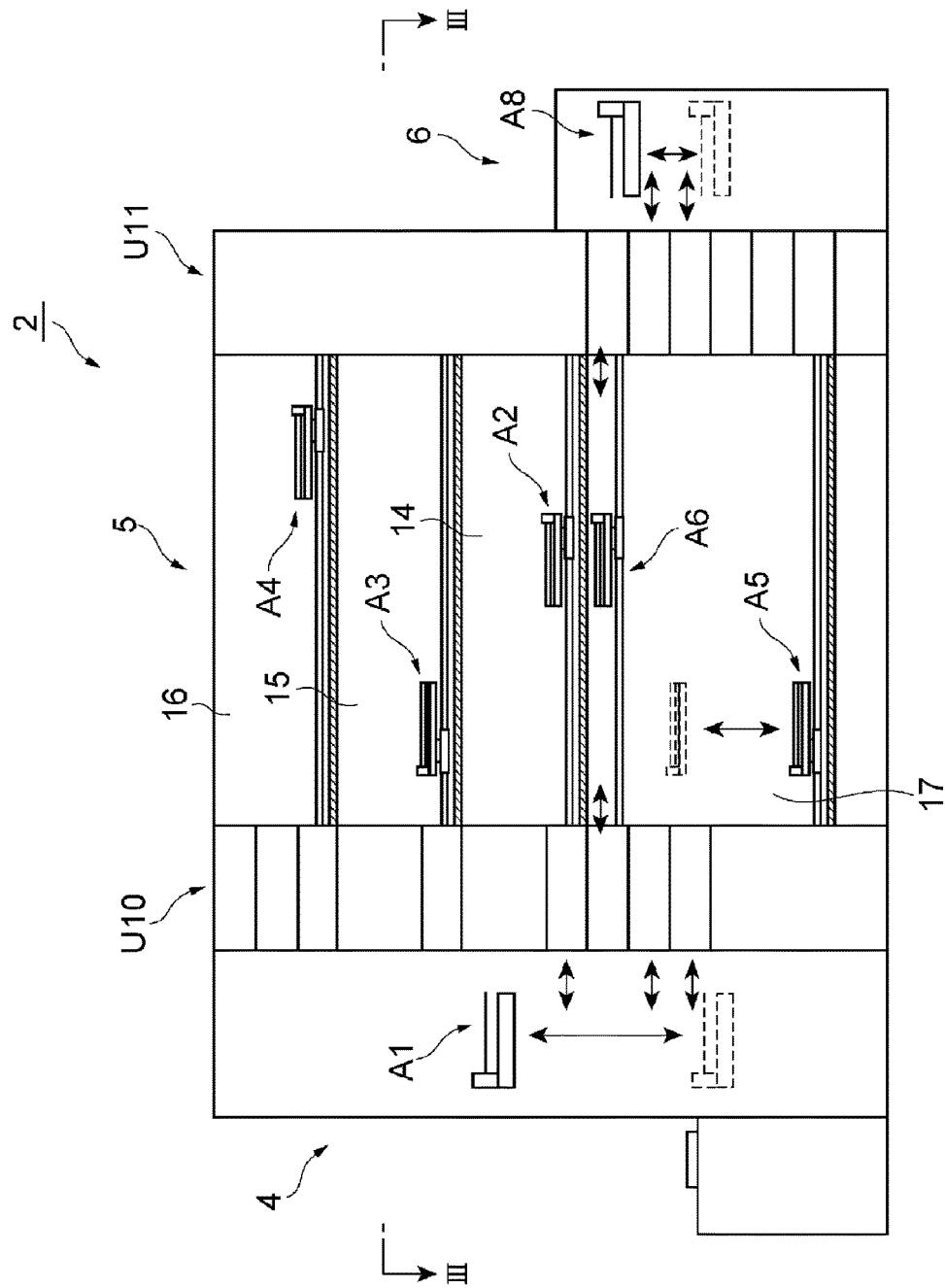
FIG. 2 is a cross-sectional view taken along a line II-II of FIG. 1.
Figure 3:
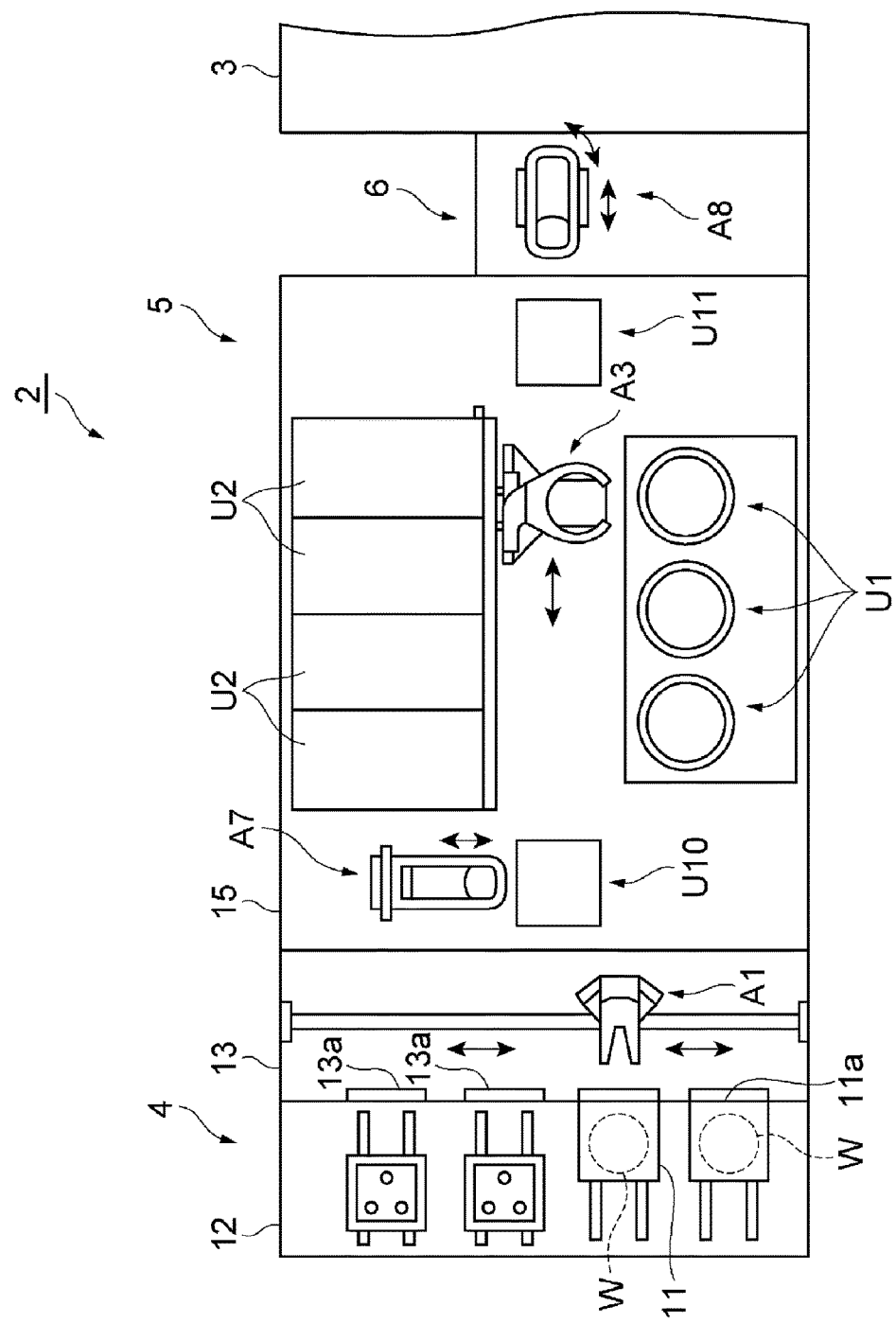
FIG. 3 is a cross-sectional view taken along a line III-III of FIG. 2.

As illustrated in FIG. 1 to FIG. 3, the coating and developing device 2 includes a carrier block 4, a processing block 5, and an interface block 6. The carrier block 4, the processing block 5, and the interface block 6 are arranged in a horizontal direction.

The carrier block 4 includes a carrier station 12 and a carry-in/out unit 13. The carrier station 12 is configured to support multiple carriers 11. The carrier 11 is configured to accommodate, for example, multiple wafers W in a sealing state, and includes an opening/closing door (not illustrated) for carrying in/out the wafer W at its side surface 11a (see FIG. 3). The carrier 11 is detachably provided on the carrier station 12 such that the side surface 11a is in contact with a side of the carry-in/out unit 13.

The carry-in/out unit 13 is positioned between the carrier station 12 and the processing block 5. The carry-in/out unit 13 includes multiple opening/closing doors 13a respectively corresponding to the multiple carriers 11 on the carrier station 12. By opening the opening/closing door on the side surface 11a and the opening/closing doors 13a at the same time, the inside of the carrier 11 communicates with the inside of the carry-in/out unit 13. A delivery arm A1 is provided in the carry-in/out unit 13. The delivery arm A1 is configured to take out the wafer W from the carrier 11, deliver the wafer W to the processing block 5, receive the wafer W from the processing block 5, and return the wafer W to the inside of the carrier 11.

The processing block 5 includes a BCT module 14, a COT module 15, a TCT module 16, and a DEV module 17. The BCT module 14 is a module for forming a lower film. The COT module 15 is a module for forming a resist film. The TCT module 16 is a module for forming an upper film. The DEV module 17 is a module for performing the developing process. The DEV module 17, the BCT module 14, the COT module 15, and the TCT module 16 are arranged in sequence from a bottom surface side.

The BCT module 14 is configured to form the lower film on the surface of the wafer W. Multiple coating units (not illustrated), multiple heat treatment units (not illustrated), and a delivery arm A2 configured to deliver the wafer W to these units are provided in the BCT module 14. The coating unit is configured to coat a coating liquid for forming the lower film on the surface of the wafer W. The heat treatment unit is configured to perform a heat treatment by heating the wafer W with, for example, a heating plate, and cooling the heated wafer W with, for example, a cooling plate. A specific example of the heat treatment to be performed in the BCT module 14 may include a heating process for forming the lower film by hardening the coating liquid.

The COT module 15 is configured to form the thermosetting or photosensitive resist film on the lower film. Multiple coating units U1, multiple heat treatment units U2, and a delivery arm A3 configured to deliver the wafer W to these units are provided in the COT module 15 (see FIG. 2 and FIG. 3). The coating unit U1 is configured to coat a processing liquid (resist liquid) for forming the resist film on the lower film. The heat treatment unit U2 is configured to perform the heat treatment by heating the wafer W with, for example, a heating plate, and cooling the heated wafer W with, for example, a cooling plate. A specific example of the heat treatment to be performed in the COT module 15 may include a heating (PAB: Pre Applied Bake) process for forming the resist film by hardening the coating liquid.

The TCT module 16 is configured to form the upper film on the resist film. Multiple coating units (not illustrated), multiple heat treatment units (not illustrated), and a delivery arm A4 configured to deliver the wafer W to these units are provided in the TCT module 16. The coating unit is configured to coat a coating liquid for forming the upper film on the surface of the wafer W. The heat treatment unit is configured to perform the heat treatment by heating the wafer W with, for example, a heating plate, and cooling the heated wafer W with, for example, a cooling plate. A specific example of the heat treatment to be performed in the TCT module 16 may include a heating process for forming the upper film by hardening the coating liquid.

The DEV module 17 is configured to perform the developing process on an exposed resist film. Multiple developing units (not illustrated), multiple heat treatment units (not illustrated), a delivery arm A5 configured to deliver the wafer W to these units, and a direct delivery arm A6 configured to deliver the wafer W without passing through these units are provided in the DEV module 17. The developing unit is configured to form a resist pattern by partially removing the resist film. The heat treatment unit is configured to perform the heat treatment by heating the wafer W with, for example, a heating plate, and cooling the heated wafer W with, for example, a cooling plate. A specific example of the heat treatment to be performed in the DEV module 17 may include a heating (PEB: Post Exposure Bake) process performed before the developing process and a heating (PB: Post Bake) process performed after the developing process.

A shelf unit U10 is prepared within the processing block 5 at a side of the carrier block 4 (see FIG. 2 and FIG. 3). The shelf unit U10 is provided to reach the TCT module 16 from a bottom surface and the shelf unit U10 includes multiple cells which are vertically arranged. An elevation arm A7 is provided in the vicinity of the shelf unit U10. The elevation arm A7 is configured to move up and down the wafer W between the cells of the shelf unit U10.

A shelf unit U11 is prepared within the processing block 5 at a side of the interface block 6 (see FIG. 2 and FIG. 3). The shelf unit U11 is provided to reach an upper portion of the DEV module 17 from the bottom surface and the shelf unit U10 includes multiple cells which are vertically arranged.

A delivery arm A8 is provided in the interface block 6, and the interface block 6 is connected to the exposure device 3. The delivery arm A8 is configured to take out the wafer W from the shelf unit U11, deliver the wafer W to the exposure device 3, receive the wafer W from the exposure device 3, and return the wafer W to the shelf unit U11.

<Configuration of Coating Unit>

Figure 4:
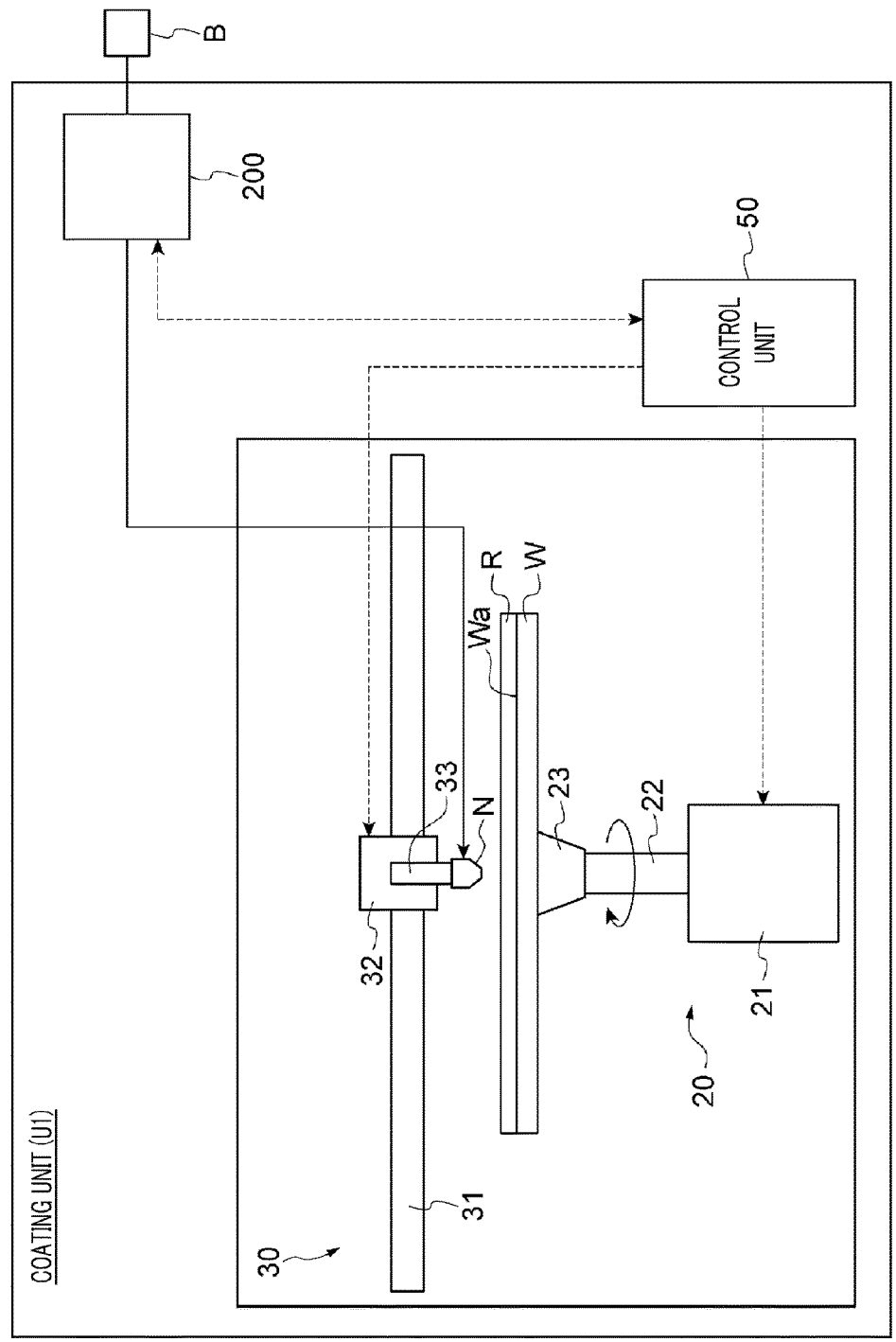
FIG. 4 is a schematic diagram illustrating a coating unit.

Hereinafter, the coating unit (coating device) U1 will be described in more detail with reference to FIG. 4. As illustrated in FIG. 4, the coating unit U1 includes a rotational holding unit 20, a driving unit 30, a pump device 200, and a control unit 50.

The rotational holding unit 20 includes a rotation unit 21 and a holding unit 23. The rotation unit 21 includes a shaft 22 which is upwardly protruded. The rotation unit 21 is configured to rotate the shaft 22 using, for example, an electric motor as a power source. The holding unit 23 is provided at a tip end portion of the shaft 22. The wafer W is placed on the holding unit 23. The holding unit 23 is configured to hold the wafer W in a substantially horizontal posture by, for example, the attraction or the like. That is, the rotational holding unit 20 is configured to rotate the wafer W around an axis (rotation axis) perpendicular to the surface of the wafer W while the wafer W is in a substantially horizontal posture. In the present exemplary embodiment, the rotation axis passes through the center of the wafer W having a circular shape and thus serves as a central axis. In the present exemplary embodiment, the rotational holding unit 20 is configured to rotate the wafer W clockwise when viewed from the top, as illustrated in FIG. 4.

The driving unit 30 is configured to drive a nozzle N. The driving unit 30 includes a guide rail 31, a sliding block 32, and an arm 33. The guide rail 31 is extended in a horizontal direction above the rotational holding unit 20 (wafer W). The sliding block 32 is connected to the guide rail 31 such that the sliding block 32 can be moved in the horizontal direction along the guide rail 31. The arm 33 is connected to the sliding block 32 such that the arm 33 can be moved in a vertical direction. The nozzle N is connected to a lower end of the arm 33.

The driving unit 30 is configured to move the sliding block 32 and the arm 33 using, for example, an electric motor as a power source (not illustrated) and move the nozzle N accordingly. When viewed from the top, the nozzle N is moved along a radial direction of the wafer W on a straight line orthogonal to the rotation axis of the wafer W while discharging the coating liquid.

The pump device 200 is configured to deliver the coating liquid to the nozzle N from a liquid source (for example, a liquid bottle B to be described later) and discharge the coating liquid from the nozzle N to a surface Wa of the wafer W in response to a control signal from the control unit 50. To be described in detail later, the pump device 200, the nozzle N, and the liquid source are components of the liquid supply system 40 for supplying the coating liquid to a target object (the wafer W in the present exemplary embodiment).

The nozzle N is downwardly opened toward the surface Wa of the wafer W. The coating liquid is a liquid used for forming a coating film R (see FIG. 4) on the surface Wa of the wafer W. Examples of the coating liquid may include a resist liquid for forming a resist pattern or a liquid for forming an anti-reflection film (for example, a bottom anti-reflection coating (BARC) film and a silicon-containing anti-reflection coating (SiARC) film). When a processing liquid discharged to the surface Wa of the wafer W is dried, the coating film R is formed on the surface Wa of the wafer W, as illustrated in FIG. 4.

The control unit 50 is configured of one or more control computers, and is configured to control the coating unit U1. The control unit 50 includes a display unit (not illustrated) configured to display a control condition setting screen, an input unit (not illustrated) configured to input a control condition, and a reading unit (not illustrated) configured to read a program from a computer-readable storage medium. The storage medium stores therein a program for executing the coating process in the coating unit U1. The program is read by the reading unit of the control unit 50. The storage medium may be, for example, a semiconductor memory, an optical recording disc, a magnetic recording disc, or a magneto-optical recording disc. The control unit 50 is configured to control the coating unit U1 according to the control condition inputted to the input unit and the program read by the reading unit and execute a coating process in the coating unit U1.

<Configuration of Liquid Supply System>

Figure 5:
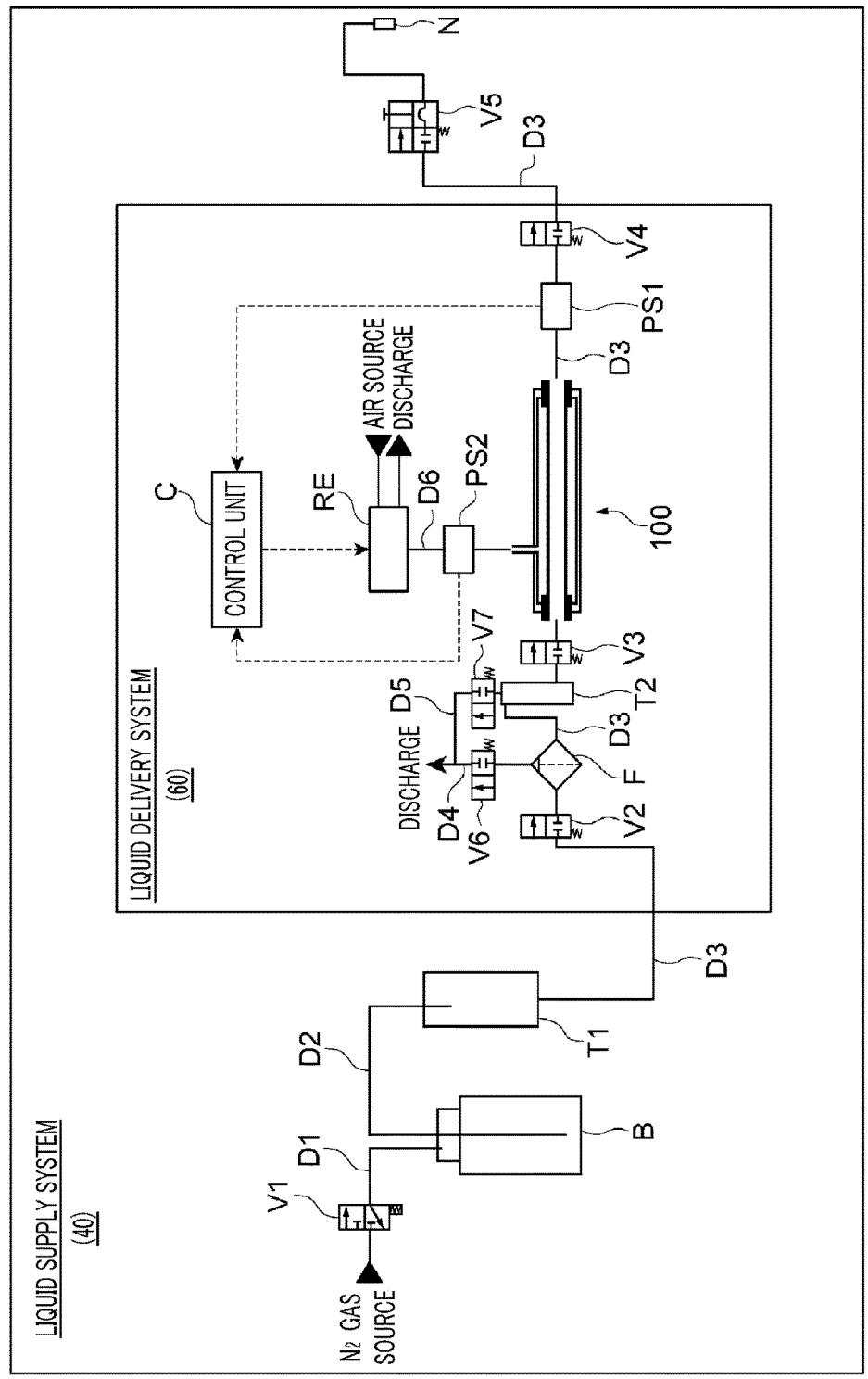
FIG. 5 is a diagram illustrating a liquid supply system.

A configuration of the liquid supply system 40 will be described with reference to FIG. 5. As illustrated in FIG. 5, the liquid supply system 40 includes the liquid bottle B, liquid tanks T1 and T2, a pump 100, a filter device F, lines (liquid delivery lines) D1 to D6, valves V1 to V7, pressure sensors (pressure measurement units) PS1 and PS2, a nozzle N, and a control unit C.

An upstream end of the line D1 is connected to a $N_2$ gas source. A downstream end of the line D1 is connected to a top lid portion of the liquid bottle B such that the downstream end of the line D1 is positioned in the vicinity of a top lid of the liquid bottle B. The liquid bottle B serves as a supply source (liquid source) for the coating liquid. The valve V1 is provided on the line D1. The valve V1 is an air operation valve configured to open/close (turn on/off) a valve using air.

An upstream end of the line D2 is connected to the top lid portion of the liquid bottle B such that the upstream end of the line D2 is positioned in the vicinity of a bottom of the liquid bottle B. A downstream end of the line D2 is connected to a top lid portion of the liquid tank T1 such that the downstream end of the line D2 is positioned in the vicinity of a top lid of the liquid tank T1. The liquid tank T1 serves as a storage tank configured to temporarily store the coating liquid discharged from the liquid bottle B.

An upstream end of the line D3 is connected to a bottom portion of the liquid tank T1. A downstream end of the line D3 is connected to the nozzle N. The valve V2, the filter device F, the liquid tank T2, the valve V3, the pump 100, the pressure sensor PS1, the valve V4, and the valve V5 are provided on the line D3 in sequence from an upstream side thereof.

The valves V2 to V5 are the same air operation valves as the valve V1. The valve V5 may have a function (flow rate control function) of controlling a flow rate of a coating liquid discharged from the nozzle N to a predetermined level. The valve V5 may have a function (suck back function) of sucking the coating liquid within the nozzle N such that the coating liquid cannot remain in the nozzle N when the discharging of the coating liquid from the nozzle N is stopped.

In the filter device F, a filter configured to remove foreign materials such as particles contained in the coating liquid is provided within a housing. In the liquid tank T2, bubbles remaining within the coating liquid discharged from an outlet of the filter device F are removed. Although will be described in detail later, the pump 100 is configured to suck the coating liquid within the liquid tank T2 and deliver the coating liquid toward the nozzle N. The pressure sensor PS1 is configured to measure a pressure (liquid pressure) of the coating liquid flowing in the pump 100 (tube 102 to be described later). The pressure sensor PS1 is configured to output a signal indicating a value of the measured liquid pressure to the control unit C.

An upstream end of the line D4 is connected to an exhaust port of the filter device F. A downstream end of the line D4 is connected to the outside of the system. For this reason, a gas separated from the coating liquid when the coating liquid passes through the filter device F is discharged to the outside of the system through the line D4. The valve V6 is provided on the line D4. The valve V6 is the same air operation valve as the valve V1.

An upstream end of the line D5 is connected to an exhaust port of the liquid tank T2. A downstream end of the line D5 is connected to the line D4 at a downstream side of the valve V6. For this reason, a gas separated from the coating liquid in the liquid tank T2 is discharged to the outside of the system through the line D5. The valve V7 is provided on the line D5. The valve V7 is the same air operation valve as the valve V1.

One end of the line D6 is connected to the pump 100 (a tube housing 104 to be described later). The other end of the line D6 is connected to an electropneumatic regulator (supply/discharge unit) RE. The electropneumatic regulator RE includes an electromagnetic valve configured to perform an opening/closing operation in response to a control signal from the control unit C. The electropneumatic regulator RE is configured to suck air from an air source or discharge air to the outside according to an opening degree of the electromagnetic valve. Thus, the electropneumatic regulator RE is configured to adjust an air pressure (a gas pressure) within the pump 100 (within an inner space V to be described later). The pressure sensor PS2 is provided on the line D6. The pressure sensor PS2 is configured to measure the air pressure (the gas pressure) within the pump 100 (within the inner space V to be described later). The pressure sensor PS2 is configured to output a signal indicating a value of the measured gas pressure to the control unit C.

The control unit C is configured of one or more control computers, and is configured to control the electropneumatic regulator RE. The control unit C includes a display unit (not illustrated) configured to display a control condition setting screen, an input unit (not illustrated) configured to input a control condition, and a reading unit (not illustrated) configured to read a program from a computer-readable storage medium. The storage medium stores therein a program for executing the liquid delivery process in the pump 100. The program is read by the reading unit of the control unit C. The storage medium may be, for example, a semiconductor memory, an optical recording disc, a magnetic recording disc, or a magneto-optical recording disc. The control unit C is configured to control the electropneumatic regulator RE according to the control condition inputted to the input unit and the program read by the reading unit and execute a liquid delivery process in the pump 100.

<Configuration of Pump>

Figure 6:
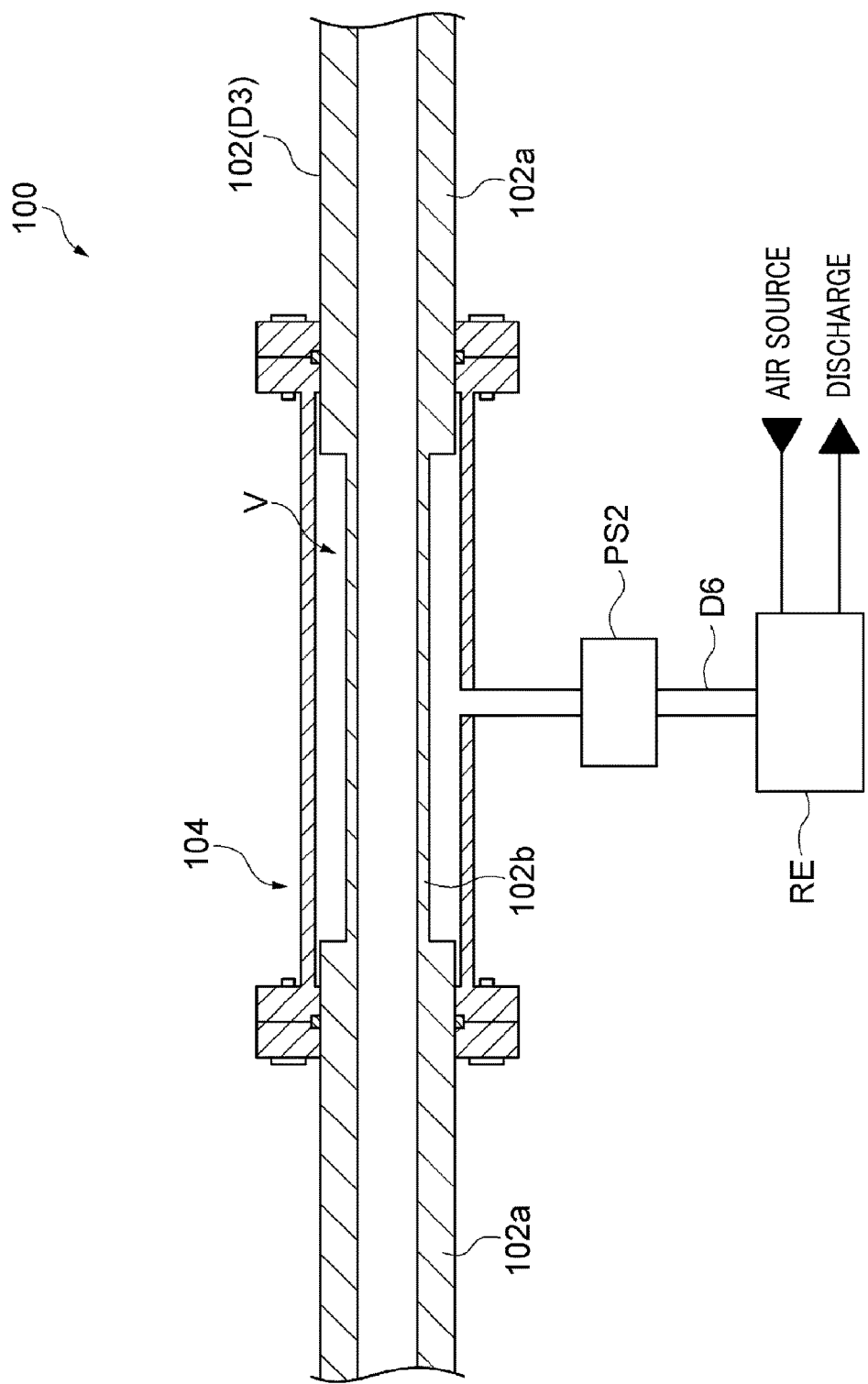
FIG. 6 is a diagram schematically illustrating a cross section of a pump.

Hereinafter, a configuration of the pump 100 will be described with reference to FIG. 6 to FIG. 7B. As illustrated in FIG. 6, the pump 100 includes the tube 102, the tube housing 104, and the above-described electropneumatic regulator RE.

The tube 102 has flexibility and elasticity. That is, the tube 102 has a property of returning to its original shape when an external force is applied to the tube 102 from the inside or the outside. The tube 102 may be formed of, for example, fluorine resin. One end of the tube 102 is connected to the valve V3 (see FIG. 5). The other end of the tube 102 is connected to the pressure sensor PS1 (see FIG. 5). That is, the tube 102 constitutes a part of the line D3. The tube 102 includes a thick portion 102*a* and a thin portion 102*b*, as illustrated in FIG. 6 to FIG. 7B.

The thick portion 102*a* has a cylindrical shape. An outer diameter of the thick portion 102*a* may be, for example, about 12.7 mm. An inner diameter of the thick portion 102*a* may be, for example, about 9.5 mm. A wall thickness of the thick portion 102*a* may be, for example, about 1.6 mm.

The thin portion 102*b* is extended between a pair of thick portions 102*a*. That is, both ends of the thin portion 102*b* are respectively connected to the thick portions 102*a*. A wall thickness of the thin portion 102*b* may be, for example, about 0.2 mm.

As illustrated in FIG. 7A and FIG. 7B, the thin portion 102*b* includes a recessed groove 102*c*. The recessed groove 102*c* is extended along a central axis of the tube 102 (an extension direction of the tube 102). The recessed groove 102*c* is recessed toward the central axis of the tube 102 (an inside of the tube 102). The thin portion 102*b* (tube 102) may include multiple recessed grooves 102*c*. In the present exemplary embodiment, the thin portion 102*b* (tube 102) includes three recessed grooves 102*c*. The three recessed grooves 102*c* are arranged to be approximately equi-spaced along a circumferential direction of the tube 102, as illustrated in FIG. 7B. That is, in the thin portion 102*b* of the present exemplary embodiment, recessed portions and protruded portions are alternately arranged to be approximately equi-spaced along its circumferential direction.

Returning to FIG. 6, the tube housing 104 has a cylindrical shape. The tube housing 104 accommodates a part of the tube 102 such that the tube housing 104 covers the outside of the tube 102. The tube housing 104 is extended coaxially with respect to the tube 102 along the central axis of the tube 102 (the extension direction of the tube 102). In other words, the tube 102 penetrates the tube housing 104. The thin portion 102b of the tube 102 is positioned within the tube housing 104. The inner space V, in which a gas (air) is kept, is formed between an outer surface of the tube 102 and the tube housing 104. One end of the line D6 is connected to the tube housing 104. Thus, the supply of the gas into the inner space V and the discharge of the gas from the inner space V are performed by the electropneumatic regulator RE.

<Pump Device>

In the present exemplary embodiment, some components constituting the above-described liquid supply system 40 also constitute the liquid delivery system 60, as illustrated in FIG. 5. Components constituting the liquid delivery system 60 may include, for example, the pump 100, the filter device F, the control unit C, the pressure sensors PS1 and PS2, the liquid tank T2, the electropneumatic regulator RE, the valves V2 to V4, V6, and V7, a part of the line D3, and the lines D4 and D5. The pump device 200 includes a housing 202 illustrated in FIG. 8 and the components constituting the liquid delivery system 60.

Figure 8:
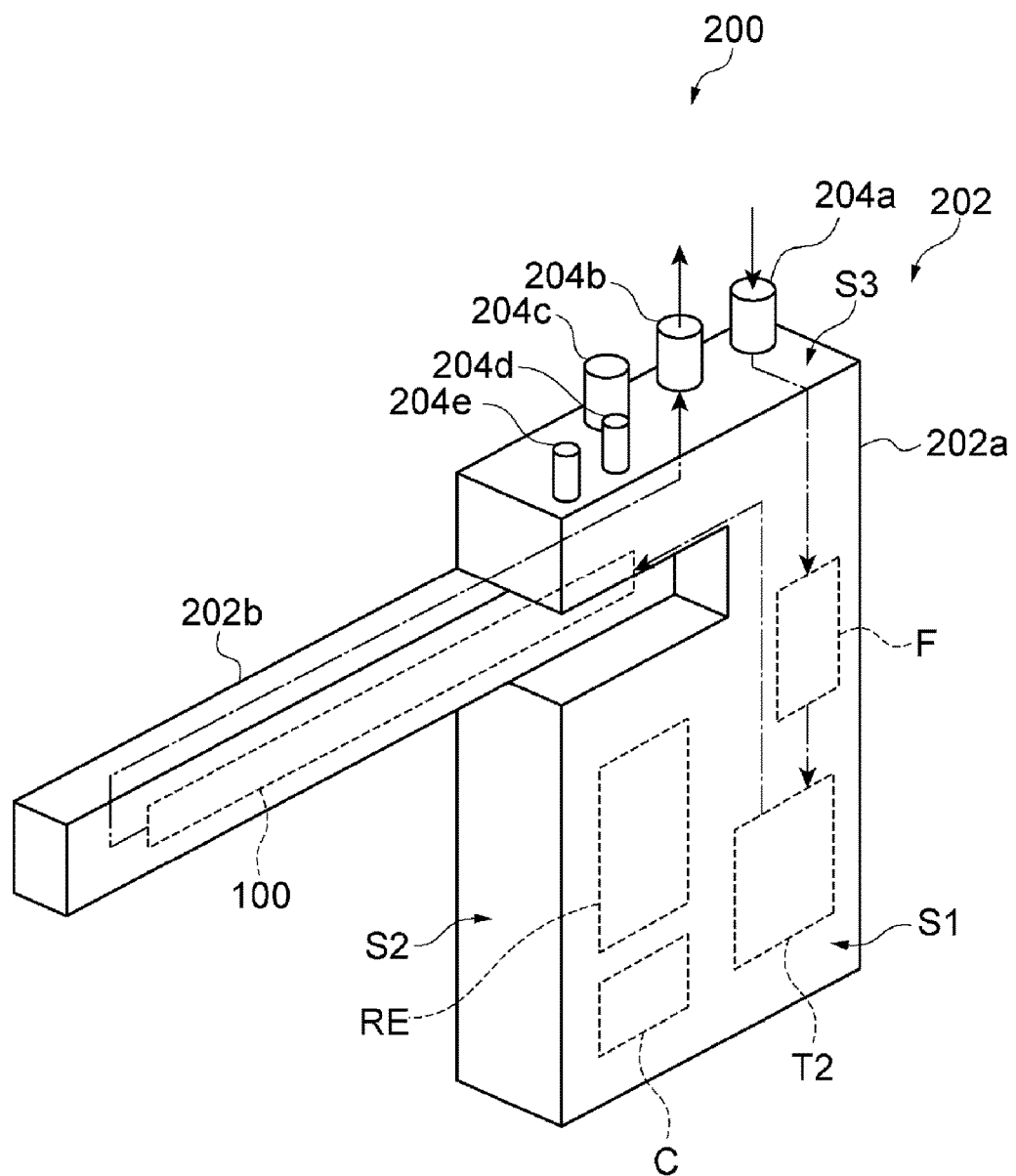
FIG. 8 is a perspective view illustrating a pump device.
Figure 9:
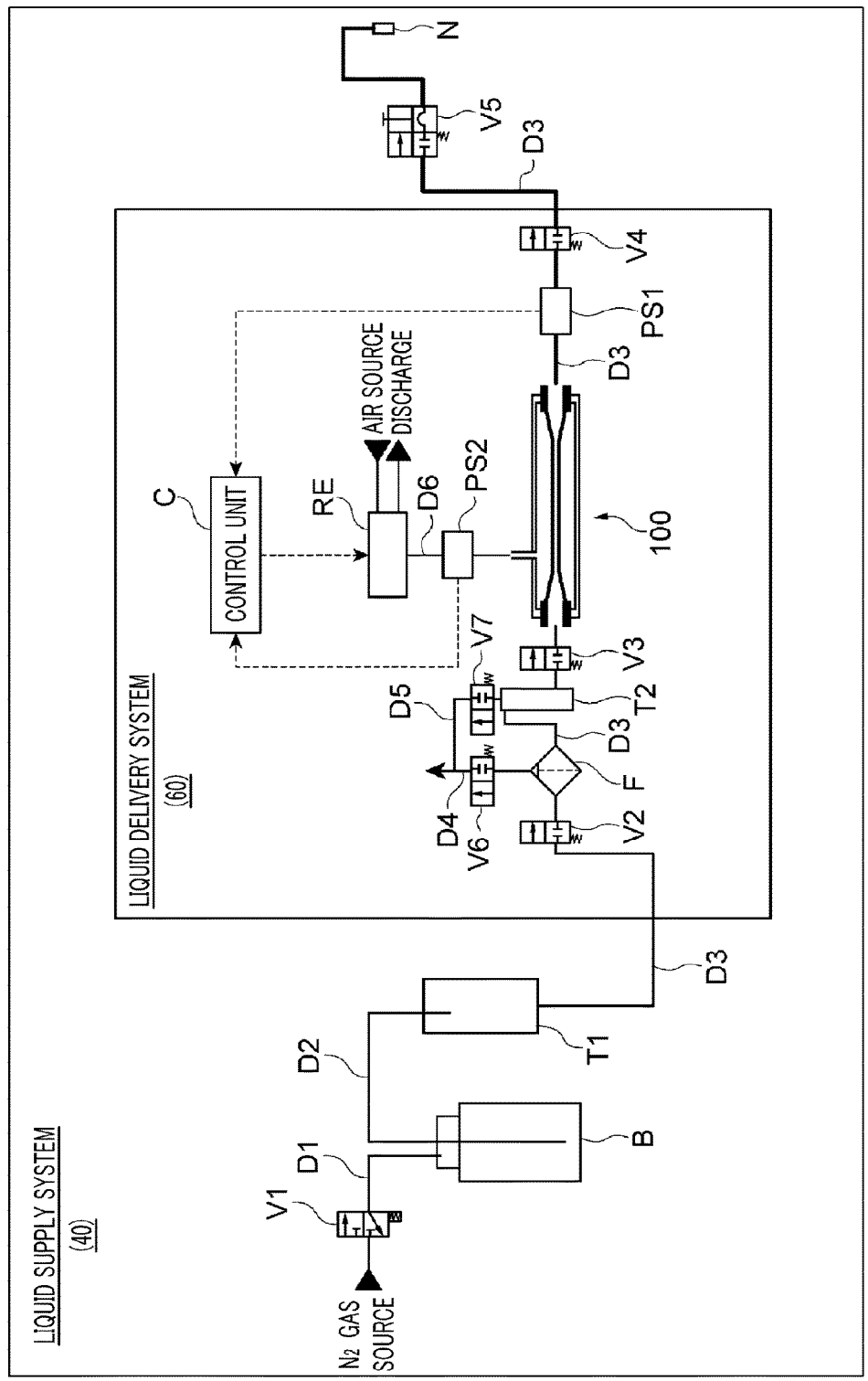
FIG. 9 is a diagram describing an operation of the liquid supply system when discharging a liquid.

The housing 202 includes a main part 202a and an extension part 202b as illustrated in FIG. 8. The main part 202a and the extension part 202b are configured as one body. The main part 202a has a hexahedral shape. The main part 202a includes a pair of main surfaces S1 each having a relatively greater area than the other surfaces; a pair of side surfaces S2; and a pair of end surfaces S3. The main part 202a accommodates at least the filter device F, the control unit C, the pressure sensors PS1 and PS2, the liquid tank T2, and the electropneumatic regulator RE among the components constituting the liquid delivery system 60.

The extension part 202b is extended in a linear shape from the side surface S2 of the main part 202a toward the outside. An extension direction of the extension part 202b corresponds to a facing direction of the pair of side surfaces S2 in the present exemplary embodiment. However, the extension direction of the extension part 202b is not limited thereto, and may correspond to a direction intersecting or orthogonal to a facing direction of the pair of main surfaces S1. A thickness of the extension part 202b in the facing direction of the main surfaces S1 is smaller than a thickness of the main part 202a in the same facing direction. The extension part 202b accommodates at least the pump 100 among the components constituting the liquid delivery system 60. The pump 100 is arranged within the extension part 202b and extended along the extension direction of the extension part 202b.

On the end surface S3 of the main part 202a, connecting members 204a to 204e are provided. The connecting member 204a is connected, outside the pump device 200, to a line at an upstream side of the pump device 200 (a part of the lines D1, D2, and the line D3 positioned at the upstream side of the pump device 200). The line positioned at the upstream side constitutes an upstream-side liquid delivery line (first liquid delivery line) connecting the liquid bottle B to the pump device 200. For this reason, the coating liquid from the liquid tank T1 is introduced into the pump device 200 through the connecting member 204a.

The connecting member 204b is connected, outside the pump device 200, to a line at a downstream side of the pump device 200 (a part of the line D3 positioned at the downstream side of the pump device 200). The line positioned at the downstream side constitutes a downstream-side liquid delivery line (second liquid delivery line) connecting the pump device 200 to the nozzle N.

In the pump device 200, the line (a part of the line D3) extended between the connecting member 204a and the connecting member 204b constitutes a liquid delivery line (third liquid delivery line) extended within the pump device 200. That is, the connecting member 204a and the connecting member 204b are connected, inside the pump device 200, to the liquid delivery line extended within the pump device 200. A part of the corresponding liquid delivery line is configured of the tube 102. For this reason, the coating liquid delivered from the pump 100 toward the downstream side (the nozzle N side) is discharged to the outside of the pump device 200 through the connecting member 204b.

The connecting member 204c is connected, outside the pump device 200, to the outside of the system via a non-illustrated line. The connecting member 204c is connected, inside the pump device 200, to the downstream end of the line D4. For this reason, a gas within the filter device F or a gas within the liquid tank T2 is discharged to the outside of the pump device 200 through the lines D4 and D5 and the connecting member 204c.

The connecting member 204d is connected, outside the pump device 200, to an air source via a non-illustrated line. The connecting member 204e is connected, outside the pump device 200, to the outside of the system via a non-illustrated line. Each of the connecting members 204d and 204e is connected, inside the pump device 200, to the electropneumatic regulator RE via a non-illustrated line. For this reason, air from the air source is introduced into the electropneumatic regulator RE through the connecting member 204d. The air within the electropneumatic regulator RE is discharged to the outside of the electropneumatic regulator RE (the outside of the pump device 200) through the connecting member 204e.

<Operation of Liquid Supply System>

Hereinafter, an operation of the liquid supply system 40 will be described.

(1) Discharge Operation

Figure 10:
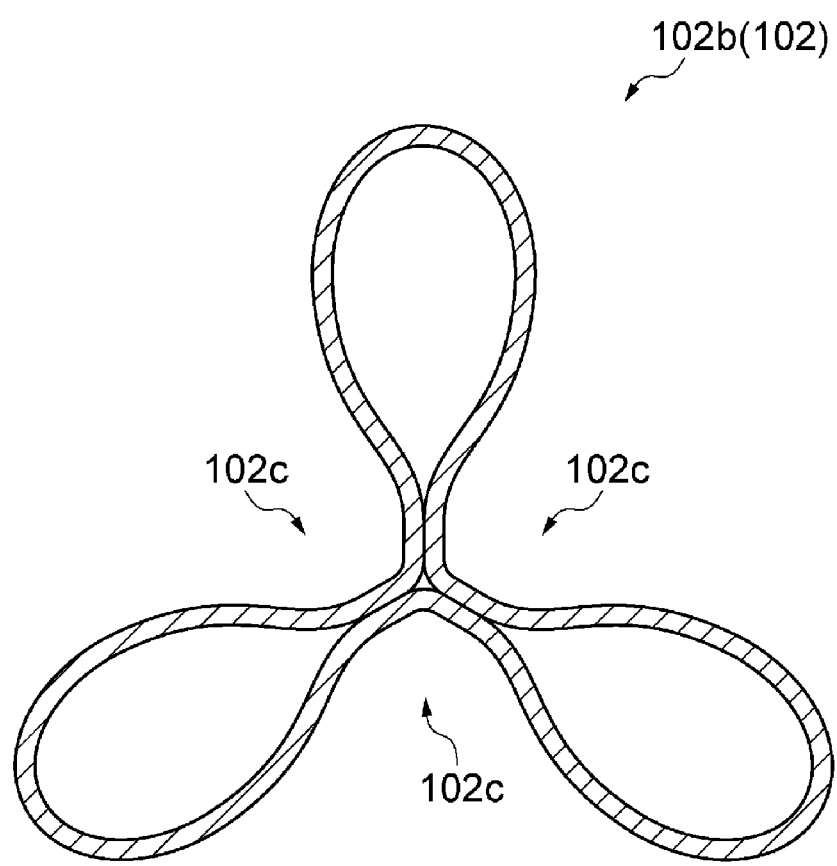
FIG. 10 is a cross-sectional view illustrating a crushed shape of a tube.
Figure 11:
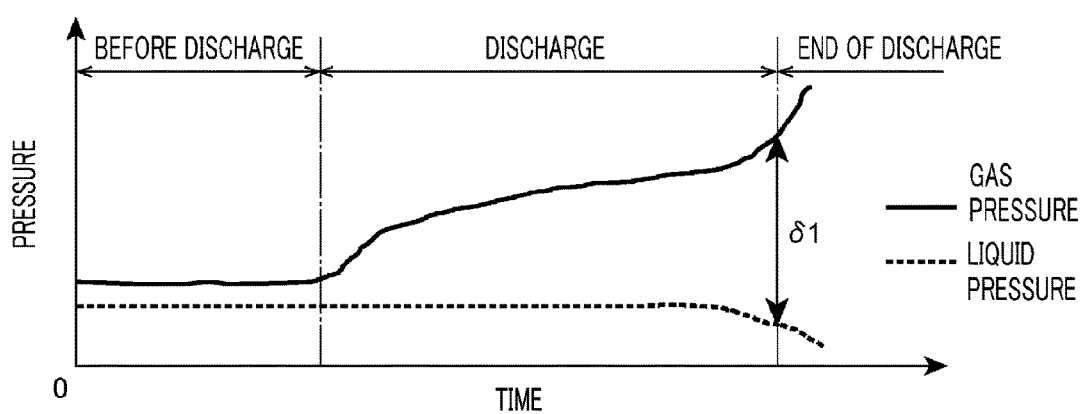
FIG. 11 is a diagram illustrating a relationship between a magnitude of a liquid pressure and a magnitude of a gas pressure in the vicinity of a tube with the lapse of time during a discharge operation.

Firstly, an operation of discharging the coating liquid from the nozzle N (discharge operation) will be described with reference to FIG. 9 to FIG. 11 and FIG. 12A. While the inside of the tube 102 is filled with the coating liquid, the control unit C closes the valves V1 to V3, V6, and V7 and opens the valves V4 and V5, and also operates the electropneumatic regulator RE to supply air into the inner space V (see process S11 of FIG. 12A). Thus, a pressure within the inner space V is increased, and the thin portion 102b of the tube 102 positioned within the inner space V is crushed by an air pressure. When the tube 102 (the thin portion 102b) is crushed, the recessed grooves 102c of the tube 102 (the thin portion 102b) become closer to each other or are brought into contact with each other, as illustrated in FIG. 10. Thus, the volume within the tube 102 (the thin portion 102b) is decreased, and the coating liquid within the tube 102 is pushed toward the opened valves V4 and V5. As a result, if the nozzle N is positioned above the wafer W, the coating liquid is discharged from the nozzle N toward the surface Wa of the wafer W.

Figure 12B:
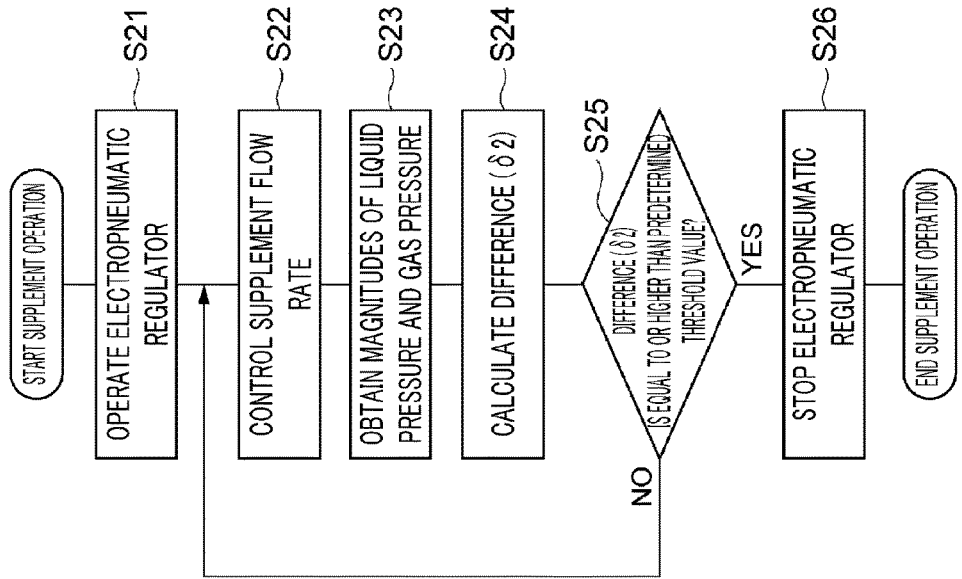
FIG. 12B is a flowchart discharge an operation during a supplement operation.
Figure 12A:
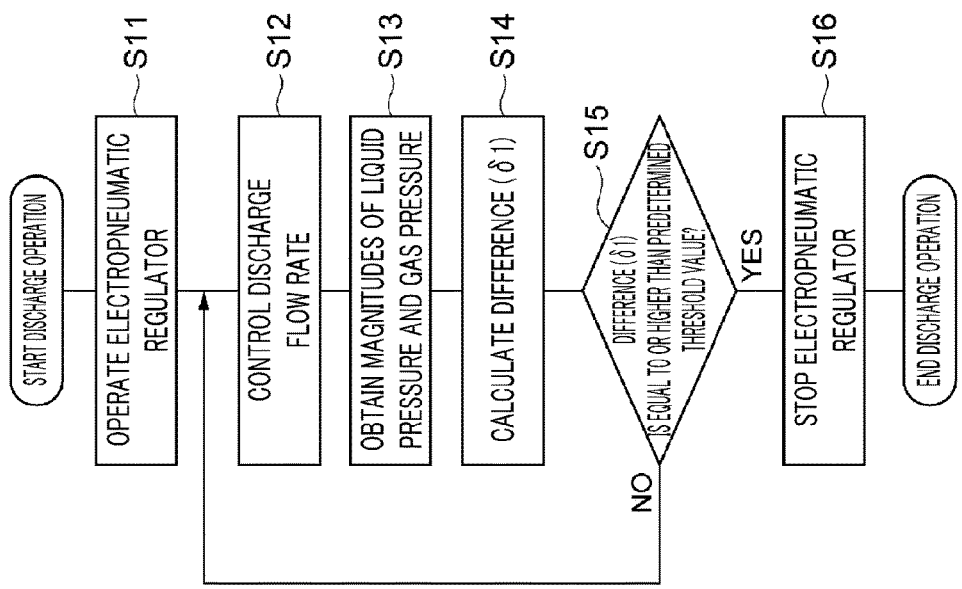
FIG. 12A is a flowchart describing an operation during the discharge operation.

During the discharge operation of the tube 102, the control unit C controls the electropneumatic regulator RE such that the discharge flow rate of the coating liquid from the tube 102 can be approximately uniform (see process S12 of FIG. 12A). To be specific, if the control unit C receives a value from the pressure sensor PS1, the control unit C controls the electropneumatic regulator RE such that the received value can be maintained at a predetermined target value and controls the pressure within the inner space V. Herein, since the tube 102 is crushed when the coating liquid is discharged from the inside of the tube 102, a reaction force generated in an outward direction with respect to the tube 102 is gradually increased. Therefore, in order to set the discharge flow rate of the coating liquid from the tube 102 to be approximately uniform, the control unit C controls the electropneumatic regulator RE such that the air pressure within the inner space V is increased as the reaction force is increased (see FIG. 11).

However, as a pressure around the tube 102 is increased, the tube 102 is deformed from the original shape to the crushed shape, and, thus, the discharge of the coating liquid from the inside of the tube 102 is accelerated. Further, when the tube 102 is deformed from the original shape to the crushed shape, a reaction force generated in the radially outward direction with respect to the tube 102 increases. The reaction force can be measured on the basis of a difference δ1 (see FIG. 11) between a magnitude of the air pressure within the inner space V (a value from the pressure sensor PS2) and a magnitude of a liquid pressure of the coating liquid (a value from the pressure sensor PS1). Therefore, it is possible to indirectly check the discharge state of the coating liquid from the tube 102 on the basis of the difference δ1. Accordingly, the control unit C receives values from the pressure sensors PS1 and PS2, respectively (see process S13 of FIG. 12A). Then, the control unit C calculates the difference δ1 from the values received from the pressure sensors PS1 and PS2, respectively (see process S14 of FIG. 12A), and determines whether or not the difference δ1 is equal to or higher than a predetermined threshold value (see process S15 of FIG. 12A). If the control unit C determines that the difference δ1 is equal to or higher than the predetermined threshold value, the control unit C detects a status of the tube 102 in which the discharge of the coating liquid from the tube 102 is completed and the tube 102 is excessively crushed, and stops the operation of the electropneumatic regulator RE (see process S16 of FIG. 12A). For this reason, a difference between the magnitude of the pressure of the coating liquid and the magnitude of the air pressure within the inner space V when the tube 102 is completely crushed is set in advance as the threshold value, and, thus, it is possible to discharge almost the whole amount of the coating liquid within the tube 102 and also possible to suppress an excessive air pressure from being applied to the tube 102. Meanwhile, if the control unit C determines that the difference δ1 is lower than the predetermined threshold value, the process returns to the process S12. Further, the process S12 and the process S13 may be performed at a certain time point while the discharge operation is performed in the tube 102.

(2) Supplement Operation

Figure 13:
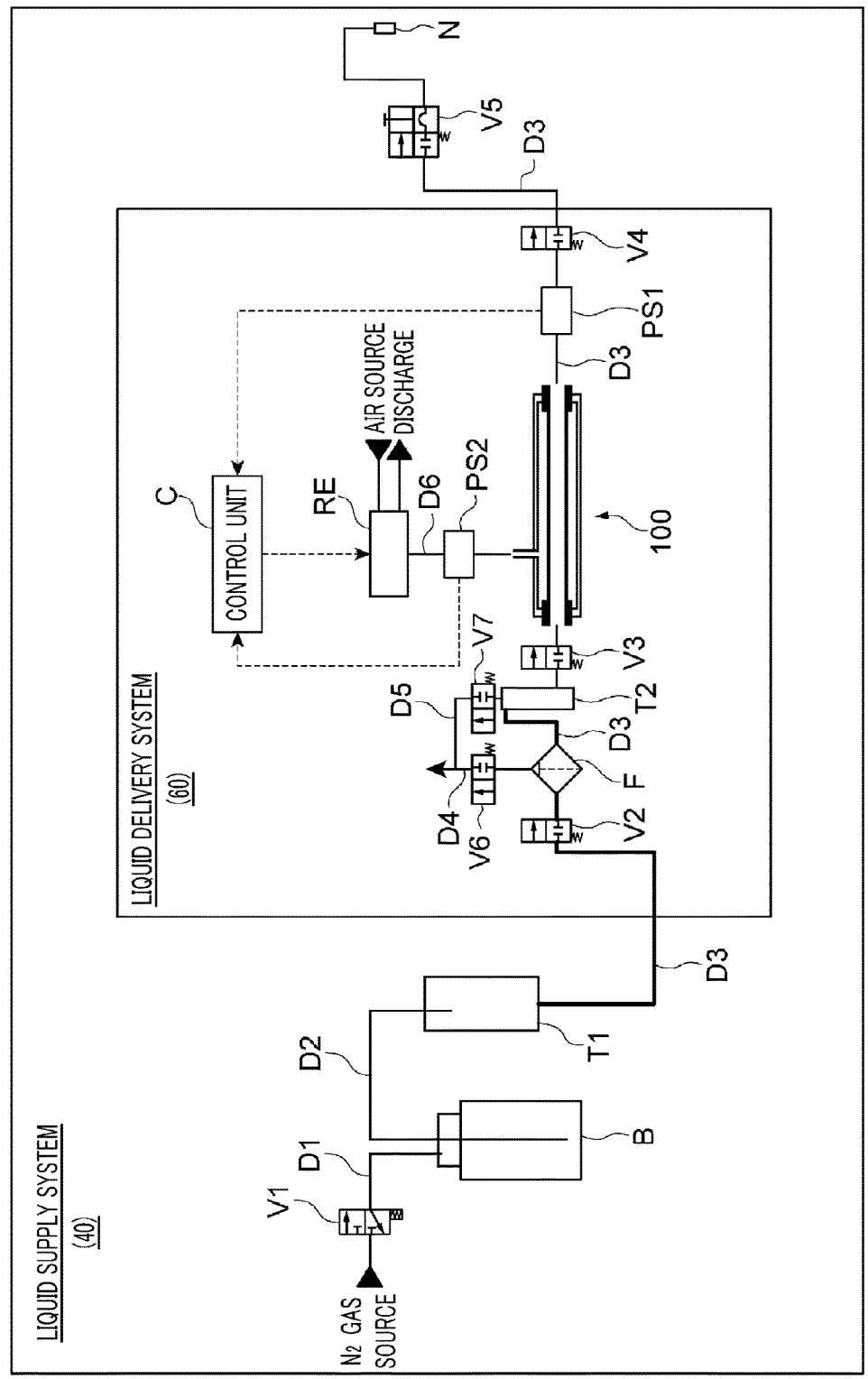
FIG. 13 is a diagram describing an operation of the liquid supply system during the supplement operation.
Figure 14:
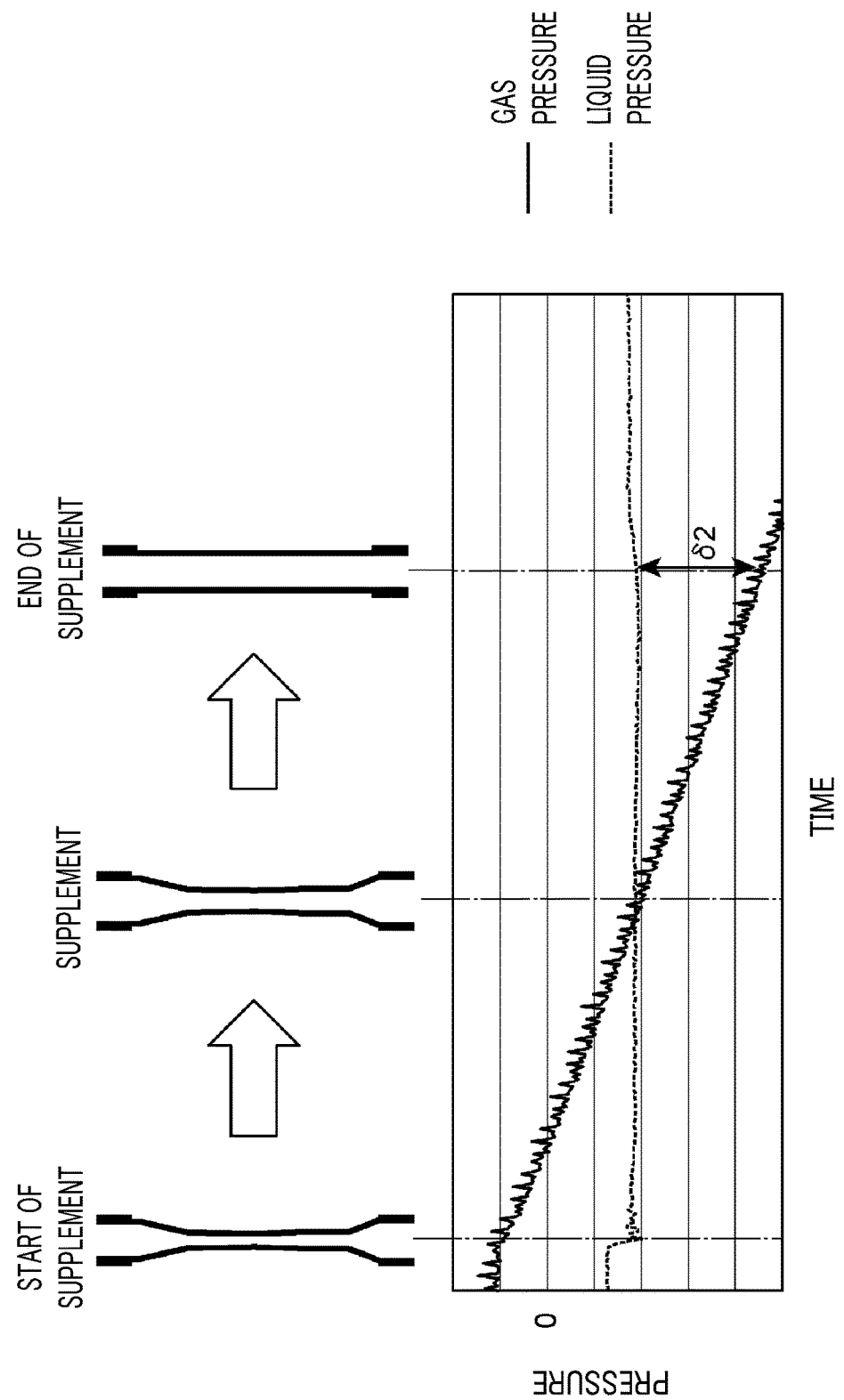
FIG. 14 a diagram illustrating a relationship between a magnitude of a liquid pressure and a magnitude of a gas pressure in the vicinity of a tube with the lapse of time during the supplement operation.

Hereinafter, an operation of supplementing the coating liquid into the tube 102 (supplement operation) will be described with reference to FIG. 13, FIG. 14 and FIG. 12B. While the inside of the tube 102 is empty or the inside of the tube 102 is not sufficiently filled with the coating liquid, the control unit C opens the valves V1 to V3 and closes the valves V4 to V7, and also operates the electropneumatic regulator RE to discharge the air from the inside of the inner space V (see process S21 of FIG. 12B). To be specific, the control unit C controls the air pressure within the inner space V with the electropneumatic regulator RE such that the magnitude of the air pressure within the inner space V is smaller than a magnitude of the reaction force generated in the outward direction with respect to the tube 102, i.e., such that the pressure sensor PS2 outputs a negative value. A $N_2$ gas from the $N_2$ gas source is introduced into the liquid bottle B through the line D1, and the coating liquid within the liquid bottle B is delivered into the liquid tank T1 through the line D2. The coating liquid within the liquid tank T1 flows into the filter device F and then is delivered into the liquid tank T2. Then, the coating liquid within the liquid tank T2 is supplied into the tube 102.

During the supplement operation of the tube 102, the control unit C controls the electropneumatic regulator RE such that a supplement flow rate of the coating liquid into the tube 102 can be approximately uniform (see process S22 of FIG. 12B). To be specific, if the control unit C receives a value from the pressure sensor PS1, the control unit C controls the electropneumatic regulator RE such that the received value can be maintained at a predetermined target value and controls a pressure within the inner space V. Herein, since the tube 102 returns to its original shape as the coating liquid is supplemented into the tube 102, the reaction force generated in the outward direction with respect to the tube 102 is gradually decreased (see FIG. 14). Therefore, in order to set the supplement flow rate of the coating liquid into the tube 102 to be approximately uniform, the control unit C controls the electropneumatic regulator RE such that the air pressure within the inner space V can be decreased as the reaction force is decreased (see FIG. 14).

However, as a pressure around the tube 102 is decreased, the tube 102 tends to return to its original shape from the crushed shape, and, thus, the filling of the inside of the tube 102 with the coating liquid is accelerated. Further, when the tube 102 returns to the original shape from the crushed shape, the reaction force generated in the radially outward direction with respect to the tube 102 decreases. The reaction force can be measured on the basis of a difference δ2 (see FIG. 14) between the magnitude of the liquid pressure of the coating liquid within the tube 102 (a value from the pressure sensor PS1) and the magnitude of the air pressure within the inner space V (a value from the pressure sensor PS2). Therefore, it is possible to indirectly check the filling state of the inside of the tube 102 with the coating liquid on the basis of the difference δ2. Accordingly, the control unit C receives values from the pressure sensors PS1 and PS2, respectively (see process S23 of FIG. 12B). Then, the control unit C calculates the difference δ2 from the values received from the pressure sensors PS1 and PS2, respectively (see process S24 of FIG. 12B), and determines whether or not the difference δ2 is equal to or higher than a preset threshold value (see process S25 of FIG. 12B). If the control unit C determines that the difference δ2 is equal to or higher than the preset threshold value, the control unit C detects a status of the tube 102 in which the inside of the tube 102 is sufficiently supplemented with the coating liquid, and stops the operation of the electropneumatic regulator RE (see process S26 of FIG. 12B). For this reason, a difference between the magnitude of the pressure of the coating liquid and the magnitude of the air pressure within the inner space V when the inside of the tube 102 is filled with the coating liquid and the tube 102 has the approximately original shape is set in advance as the threshold value. As a result, it is possible to fill the tube 102 with a sufficient amount of the coating liquid and also possible to suppress the inside of the tube 102 from being filled with an excessive amount of the coating liquid. Meanwhile, if the control unit C determines that the difference δ2 is lower than the preset threshold value, the process returns to the process S22. Further, the process S22 and the process S23 may be performed at a certain time point while the supplement operation is performed in the tube 102.

(3) Recovery Operation

Figure 15:
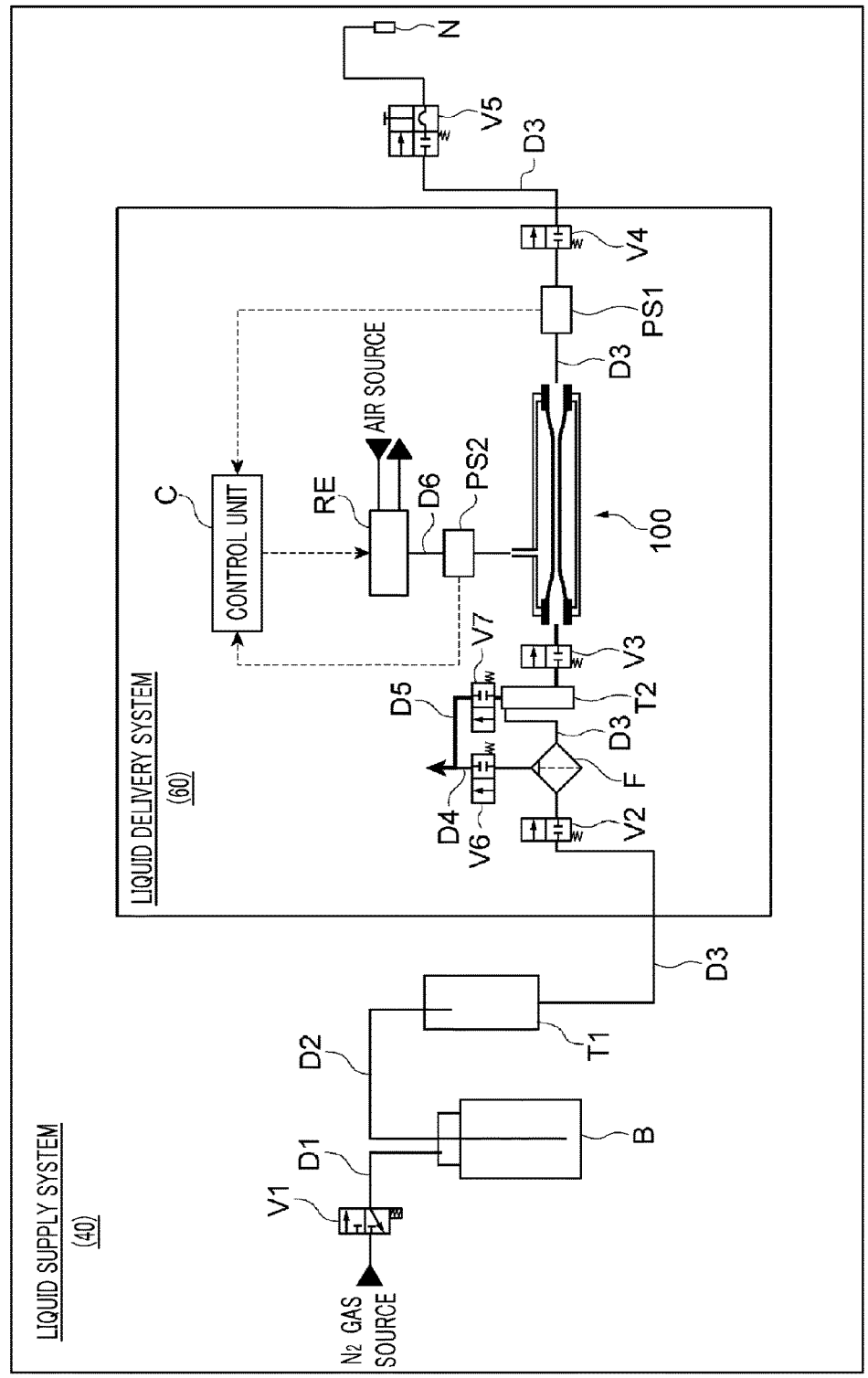
FIG. 15 is a diagram describing an operation of the liquid supply system when recovering the liquid.

Hereinafter, an operation of recovering the coating liquid from the inside of the tube 102 (discharge operation) will be described with reference to FIG. 15. The recovery operation is the same as the discharge operation except that the coating liquid within the tube 102 is recovered to the upstream side. The recovery operation may be performed, for example, when bubbles are mixed in the coating liquid within the tube 102.

While the inside of the tube 102 is filled with the coating liquid, the control unit C opens the valves V3 and V7 and closes the valves V1, V2, and V4 to V6, and also operates the electropneumatic regulator RE to supply air into the inner space V. Thus, the pressure within the inner space V is increased, and the thin portion 102b of the tube 102 positioned within the inner space V is crushed by the air pressure. When the tube 102 (the thin portion 102b) is crushed, the recessed grooves 102c of the tube 102 (the thin portion 102b) become closer to each other or are brought into contact with each other (see FIG. 10). Thus, the volume within the tube 102 (the thin portion 102b) is decreased, and the coating liquid within the tube 102 is pushed toward the opened valve V3. As a result, the coating liquid is returned to the liquid tank T2. Since the valve V7 is opened, if bubbles are mixed in the coating liquid, the gas is discharged to the outside of the system through the lines D4 and D5.

In the same manner as the discharge operation, during the recovery operation, a recovery flow rate of the coating liquid from the tube 102 may be controlled to be approximately uniform. In the same manner as the discharge operation, during the recovery operation, if the difference δ1 (see FIG. 11) is equal to or higher than a predetermined threshold value, the control unit C may detect a status of the tube 102 in which the tube 102 is excessively crushed, and stop the operation of the electropneumatic regulator RE.

<Operation Effect>

In the present exemplary embodiment described above, the electropneumatic regulator RE supplies and discharges a gas into/from the inner space V to increase and decrease the pressure around the tube 102. For this reason, when the pressure around the tube 102 is increased, the tube 102 is crushed and the coating liquid (liquid) within the tube 102 is pushed out of the tube 102. Meanwhile, when the pressure around the tube 102 is decreased, the tube 102 is expanded and the inside of the tube 102 is filled with the coating liquid. As compared with a bellows pump or a diaphragm pump, the tube 102 has fewer narrow space where it is easy for the coating liquid to stay. For this reason, it is possible to suppress the stay of the coating liquid. Therefore, a concentration of particles in the coating liquid is not easily increased. Further, in the present exemplary embodiment, the air pressure is applied to the tube 102 in order to deliver the coating liquid. For this reason, as compared with the case where the liquid pressure is applied to the tube 102, a configuration can be simplified.

In the present exemplary embodiment, the tube 102 includes the recessed grooves 102c which are extended along the central axis and recessed toward the central axis. With the recessed grooves 102c, the vicinity of the recessed grooves 102c in the tube 102 is easily deformed. Therefore, if the pressure around the tube 102 is increased or decreased, the vicinity of the recessed grooves 102c is crushed or expanded in the radial direction of the tube 102 more easily than the other portions. As such, in the tube 102 including the recessed grooves 102c, the tube 102 is likely to be continuously deformed in the vicinity of the recessed grooves 102c according to the air pressure around the tube 102, and, thus, it is possible to suppress a sudden deformation of the tube 102.

However, if the tube 102 does not penetrate the tube housing 104, connection members for connecting the tube 102 to another liquid delivery line may be needed at inlet/outlet openings of the tube housing 104. For this reason, there may be a narrow space in the connection member. However, in the present exemplary embodiment, the tube 102 is extended to penetrate the tube housing 104 and the thin portion 102b of the tube 102 is positioned within the tube housing 104. As a result, the above-described connection member is not needed, and a joint portion for the tube 102 is not formed at a boundary between the inside and the outside of the tube housing 104. Therefore, a narrow space is not easily formed in the tube 102 and in the liquid delivery line constituted, at least in part, by the tube 102. Therefore, it is possible to further suppress the stay of the coating liquid.

In the present exemplary embodiment, the tube 102 includes the three recessed grooves 102c and the three recessed grooves 102c are arranged to be approximately equi-spaced along the circumferential direction of the tube 102. For this reason, if the pressure around the tube 102 is increased, the tube 102 is approximately uniformly crushed in the circumferential direction of the tube 102. Therefore, it is difficult for the tube 102 to be locally and severely deformed, so that an excessive stress is not easily applied to the tube 102. Further, since the tube 102 includes the three recessed grooves 102c, it is possible to scale down the tube 102 while securing the deformation amount of the tube 102. Furthermore, if the tube 102 includes two recessed grooves 102c or less, when the pressure around the tube 102 is increased, the walls of the tube 102 are entirely brought into contact with each other, so that it becomes difficult to control the liquid delivery flow rate. If the tube 102 includes four recessed grooves 102c or more, it is difficult for the tube 102 to be crushed, and, thus, the tube 102 may be scaled up to solve such a problem.

In the present exemplary embodiment, the inner space V between the tube housing 104 covering the outside of the tube 102 and the outer surface of the tube 102 is filled with air (gas). That is, the air is used as a working fluid for operating the tube 102. For this reason, a mechanism for supplying the air into the inner space V and discharging the air from the inner space V is needed, but a relatively complicated driving mechanism such as a piston or a motor may not be used. Therefore, it is possible to deliver the liquid with a simple configuration.

However, for example, if the working gas within the inner space V is highly pressurized to be applied to the tube 102, the tube 102 is deformed to be crushed, and the reaction force returning to its original shape is generated in the radially outward direction with respect to the tube 102. Since a gas is a compressible fluid, if the reaction force is generated in the radially outward direction with respect to the tube 102, a pressure substantially applied to the delivery liquid via the tube 102 is decreased. Further, as the deformation amount of the tube 102 increases, the reaction force generated in the radially outward direction with respect to the tube 102 tends to increase. Therefore, it is difficult to check the status of the tube 102 since the pressure of the working gas is not in direct proportion to the flow rate of the delivery liquid. It is the same in the case where the working gas within the inner space V has a low pressure and the crushed tube 102 is expanded to return to its original shape.

Herein, a difference between the pressure of the working gas applied to the tube 102 from the outside and the pressure of the delivery liquid applied to the tube 102 from the inside corresponds to a pressure substantially applied to the tube 102. For this reason, as the difference increases, the deformation amount of the tube 102 increases and also, the reaction force generated in the tube 102 increases. With attention to this phenomenon, in the present exemplary embodiment, the status of the tube 102 is detected on the basis of the difference (δ1, δ2) between the magnitude of the pressure of the delivery liquid and the magnitude of the pressure of the working gas. For this reason, the status of the tube 102, which is difficult to be directly detected by a device such as a sensor, can be appropriately detected using the difference (δ1, δ2).

In the present exemplary embodiment, the air is supplied into and discharged from the inner space V in order to maintain the value from the pressure sensor PS1 at the predetermined target value (approximately uniform value). In this case, the discharge flow rate of the coating liquid from the tube 102 or the filling flow rate of the coating liquid into the tube 102 becomes approximately uniform. If the discharge flow rate is approximately uniform, it becomes easy to uniformly supply the coating liquid to the surface Wa of the wafer W. If the filling flow rate is approximately uniform, it becomes difficult to accidentally fill the tube 102 with a great amount of the coating liquid, and, thus, it is possible to suppress damage on the tube 102.

Another Exemplary Embodiment

Figure 16:
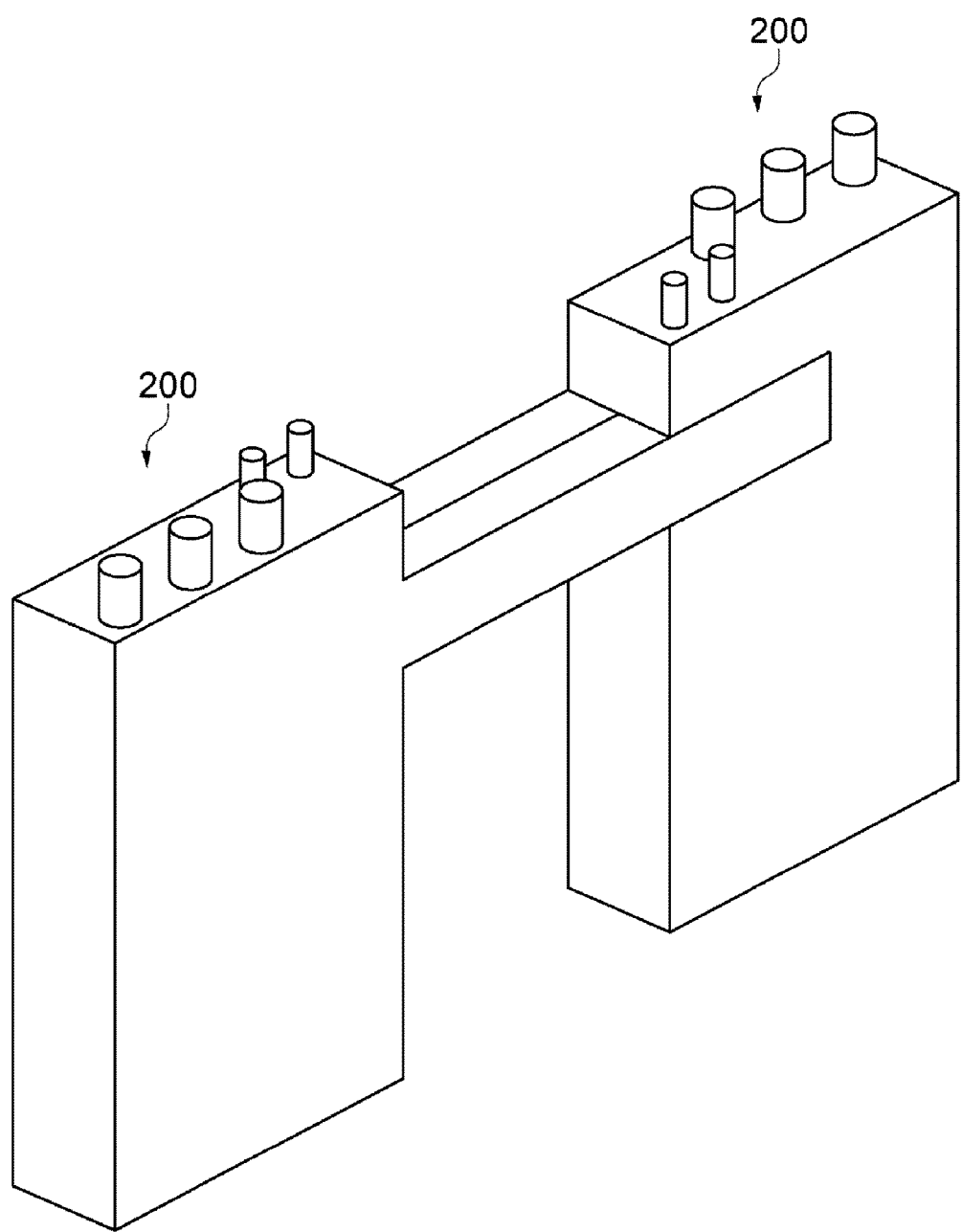
FIG. 16 is a perspective view illustrating a pair of pump devices.

Although the exemplary embodiment has been described in detail, various modifications and changes may be added to the above-described exemplary embodiment within the scope of the present disclosure. By way of example, two pump devices 200 may be combined and used as a pair or a set of pump devices. Herein, a volume of the pair of pump devices may be increased depending on a method of assembling two pump devices. Therefore, as illustrated in FIG. 16, in a state where the main parts 202a of the two pump devices 200 are not overlapped with each other, a pair of pump devices may be assembled by overlapping the extension part 202b of one pump device 200 with the extension part 202b of the other pump device 200. In this case, though the entire length of the assembled pump devices is increased, the extension parts 202b having small thicknesses are overlapped with each other. For this reason, it is possible to scale down the pair of pump devices as a whole with a small thickness of the pair of pump devices.

Figure 17:
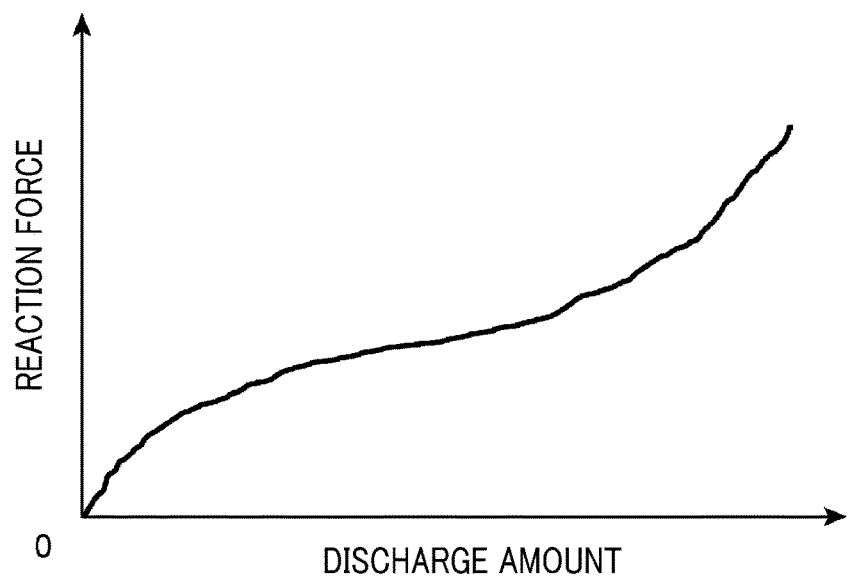
FIG. 17 is a diagram illustrating a relationship between a discharge amount of the liquid from the tube and a reaction force generated in the tube.

However, when the tube 102 is crushed as the pressure within the inner space V is increased, the discharge amount of the coating liquid from the tube 102 is increased. Similarly, when the tube 102 is crushed as the pressure within the inner space V is increased, the tube 102 returns to its original shape. Therefore, the magnitude of the reaction force generated in the radially outward direction with respect to the tube 102 is increased. For this reason, if the difference δ1 is lower than the predetermined threshold value (if the tube 102 is in a state before the tube 102 is completely crushed), as illustrated in FIG. 17, a positive correlation, in which one increases and the other also increases, is formed between the reaction force and the discharge amount. Therefore, a relationship between the reaction force and the discharge amount may be obtained in advance from an experiment, and the discharge amount of the coating liquid discharged from the tube 102 may be estimated on the basis of the value of the difference δ1. Further, based on a change of the discharge amount (a change of the reaction force) with the lapse of time, the discharge flow rate of the coating liquid discharged from the tube 102 may be estimated on the basis of the value of the difference δ1. That is, the discharge amount or the discharge flow rate can be detected as a status of the tube 102 on the basis of the difference δ1. If the amount of the coating liquid already provided within the tube 102 is identified, it is also possible to detect an amount of the residual coating liquid within the tube 102 as a status of the tube 102 on the basis of the difference δ1.

Although the target value is set such that the value from the pressure sensor PS1 is approximately uniform in each of the discharge operation, the supplement operation, and the recovery operation in the present exemplary embodiment, a predetermined target value which is changed with the lapse of time may be used. Otherwise, such a control may not be performed. In these cases, a status of the tube 102 can be detected on the basis of the differences δ1 and δ2.

Although a difference between the magnitude of the pressure of the coating liquid and the magnitude of the air pressure within the inner space V when the tube 102 is completely crushed is set in advance as the threshold value in the discharge operation in the present exemplary embodiment, such a difference before the tube 102 is completely crushed may be set as the threshold value. In this case, it is possible to detect the completion of the discharge of the liquid in a predetermined amount from the tube 102.

Although a difference between the magnitude of the pressure of the coating liquid and the magnitude of the air pressure within the inner space V when the tube 102 is in the approximately original shape is set in advance as the threshold value in the supplement operation in the present exemplary embodiment, such a difference when the tube 102 is in another shape may be set as the threshold value if it is possible to suppress the inside of the tube 102 from being filled with an excessive amount of the coating liquid. In this case, it is possible to detect the completion of the filling of the tube 102 with the liquid in a predetermined amount.

Although the air is supplied into the inner space V by the electropneumatic regulator RE in the present exemplary embodiment, any gas (for example, a nitrogen gas or an inert gas having low chemical reactivity) may be used instead of the air.

Although the present disclosure is applied to the coating unit U1 included in the COT module 15 in the present exemplary embodiment, the present disclosure may be applied to another unit instead of the coating unit U1.

The control unit 50 may serve as the control unit C, or the control unit C may serve as the control unit 50.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A liquid delivery method comprising:
allowing a liquid to flow in a tube having elasticity depending on a pressure of a gas filled in an inner space between a tube housing covering an outside of the tube and an outer surface of the tube;
obtaining a magnitude of a pressure of the liquid flowing in the tube as a first value by measuring, at an outlet of the tube, the pressure of the liquid before the liquid flowing from the tube has flowed through any valve;

obtaining a magnitude of the pressure of the gas filled in the inner space accommodating the tube as a second value;

calculating a difference between the first value and the second value as a third value;

measuring a reaction force generated in a radially outward direction with respect to the tube on the basis of the third value;

detecting a status of the tube including a discharge state of the liquid from the tube on the basis of the reaction force; and supplying the gas into the inner space from outside the inner space or discharging the gas from the inner space to outside the inner space to maintain the first value at a predetermined value, wherein, in the detecting of the status of the tube, under a state where an inside of the tube is filled with the liquid as the gas is discharged from the inner space, when the third value reaches a first threshold value, it is detected that a filling of the liquid in the tube is completed.

2. The liquid delivery method of claim 1, further comprising:

stopping a discharge of the gas from the inner space when the third value reaches the first threshold value.

3. The liquid delivery method of claim 1, wherein, in the detecting of the status of the tube, under a state where the liquid is discharged from the tube as the gas is supplied into the inner space, when the third value reaches a second threshold value, it is detected that a discharge of the liquid from the tube is completed.

4. The liquid delivery method of claim 3, further comprising:

stopping a supply of the gas into the inner space when the third value reaches the second threshold value.

5. The liquid delivery method of claim 3, wherein when the third value is lower than the second threshold value, a discharge amount of the liquid from the tube is estimated on the basis of the third value.

6. A liquid delivery system comprising:

a pump;

a first pressure measurement unit and a second pressure measurement unit; and a control unit, wherein the pump includes:

a tube, having elasticity, in which a liquid as a delivery target flows;

a tube housing which covers an outside of the tube and keeps a gas in an inner space between an outer surface of the tube and the tube housing; and a supply/discharge unit configured to supply the gas into the inner space from outside the pump and discharge the gas from the inner space to outside the pump, wherein the first pressure measurement unit is configured to measure, at an outlet of the tube, a magnitude of a pressure of the liquid flowing in the tube before the liquid flowing from the tube has flowed through any valve, the second pressure measurement unit is configured to measure a magnitude of a pressure of the gas in the inner space accommodating the tube, and the control unit is configured to calculate, as a third value, a difference between a first value as the magnitude of the pressure measured by the first pressure measurement unit and a second value as the magnitude of the pressure measured by the second pressure measurement unit, and configured to measure a reaction force generated in a radially outward direction with respect to the tube on the basis of the third value, detect a status of the tube including a discharge state of the liquid from the tube on the basis of the reaction force and under a state where an inside of the tube is filled with the liquid as the gas is discharged from the inner space, when the third value reaches a first threshold value, detect that a filling of the liquid in the tube is completed, wherein the supply/discharge unit is further configured to maintain the first value at a predetermined value.

7. A non-transitory computer-readable storage medium having stored thereon computer-executable instructions that, in response to execution, cause a liquid delivery system to perform a liquid delivery method as claimed in claim 1.

8. The liquid delivery method of claim 1, wherein the tube has recessed grooves becoming closer to each other as the tube is crushed by the gas filled in the inner space.

9. The liquid delivery system of claim 6, wherein the tube has recessed grooves becoming closer to each other as the tube is crushed by the gas filled in the inner space.

* * * * *